(12) United States Patent
Saito

(10) Patent No.: US 8,878,270 B2
(45) Date of Patent: Nov. 4, 2014

(54) SEMICONDUCTOR MEMORY DEVICE

(75) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 49 days.

(21) Appl. No.: 13/443,928

(22) Filed: Apr. 11, 2012

(65) Prior Publication Data
US 2012/0261664 A1 Oct. 18, 2012

(30) Foreign Application Priority Data

Apr. 15, 2011 (JP) .................................. 2011-091534
May 14, 2011 (JP) .................................. 2011-108898

(51) Int. Cl.
| | | |
|---|---|---|
| H01L 31/18 | (2006.01) | |
| H01L 49/02 | (2006.01) | |
| H01L 29/786 | (2006.01) | |
| H01L 27/02 | (2006.01) | |
| H01L 27/12 | (2006.01) | |
| H01L 21/84 | (2006.01) | |
| H01L 27/108 | (2006.01) | |

(52) U.S. Cl.
CPC ............ *H01L 29/7869* (2013.01); *H01L 28/90* (2013.01); *H01L 27/10891* (2013.01); *H01L 28/86* (2013.01); *H01L 27/0288* (2013.01); *H01L 27/10876* (2013.01); *H01L 27/1203* (2013.01); *H01L 28/60* (2013.01); *H01L 21/84* (2013.01)
USPC .................... 257/301; 257/E21.647; 257/327; 257/296

(58) Field of Classification Search
USPC ............ 257/301, E21.647, 327.084, 300, 296
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Michael Shingleton
(74) *Attorney, Agent, or Firm* — Fish & Richardson P.C.

(57) ABSTRACT

A semiconductor memory device including a bit line, a word line, a transistor, and a capacitor is provided. The transistor includes source and drain electrodes; an oxide semiconductor film in contact with at least both top surfaces of the source and drain electrodes; a gate insulating film in contact with at least a top surface of the oxide semiconductor film; a gate electrode which overlaps with the oxide semiconductor film with the gate insulating film provided therebetween; and an insulating film covering the source and drain electrodes, the gate insulating film, and the gate electrode. The transistor is provided in a mesh of a netlike conductive film when seen from the above. Here, the drain electrode and the netlike conductive film serve as one and the other of a pair of capacitor electrodes of the capacitor. A dielectric film of the capacitor includes at least the insulating film.

15 Claims, 22 Drawing Sheets

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,408,196 | B2 | 8/2008 | Kurokawa |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,058,672 | B2 | 11/2011 | Kurokawa |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0173980 | A1* | 7/2009 | Cheng et al. .................. 257/301 |
| 2009/0184392 | A1* | 7/2009 | Cheng et al. .................. 257/532 |
| 2009/0230471 | A1* | 9/2009 | Li et al. ......... 257/347 |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0102373 | A1* | 4/2010 | Li et al. ......... 257/301 |
| 2010/0109002 | A1 | 5/2010 | Itagaki et al. |
| 2010/0127325 | A1* | 5/2010 | Lim et al. ...... 257/334 |
| 2011/0204429 | A1* | 8/2011 | Cho et al. ....... 257/301 |
| 2012/0032181 | A1 | 2/2012 | Kurokawa |
| 2012/0171821 | A1* | 7/2012 | Cheng et al. .................. 438/155 |
| 2012/0187410 | A1* | 7/2012 | Yamazaki et al. .............. 257/66 |
| 2012/0261664 | A1* | 10/2012 | Saito .............. 257/57 |
| 2013/0256658 | A1* | 10/2013 | Takemura ......... 257/43 |
| 2013/0292675 | A1* | 11/2013 | Tsubuku et al. ................. 257/57 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-021712 A | 1/1993 |
| JP | 05-145036 A | 6/1993 |
| JP | 05-251705 A | 9/1993 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-347510 A | 12/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

(56) References Cited

OTHER PUBLICATIONS

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

(56) References Cited

OTHER PUBLICATIONS

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED" IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

\* cited by examiner

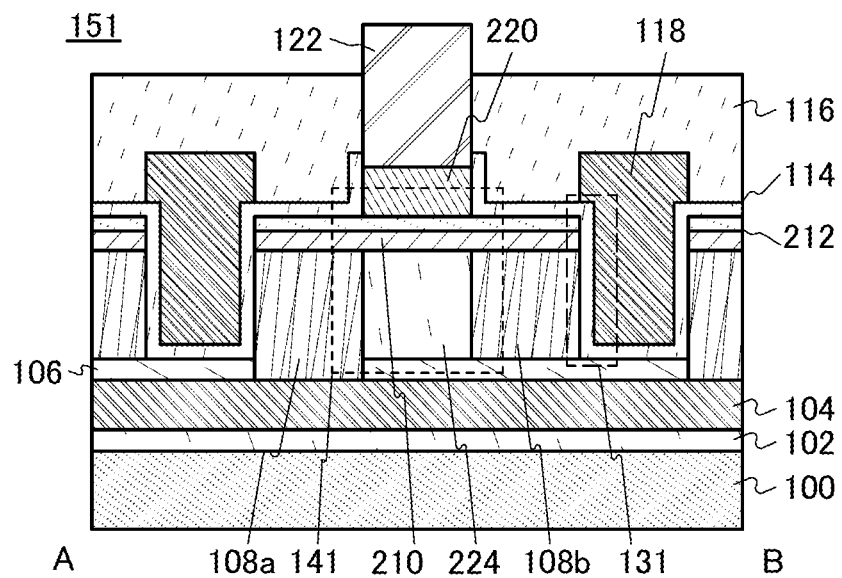
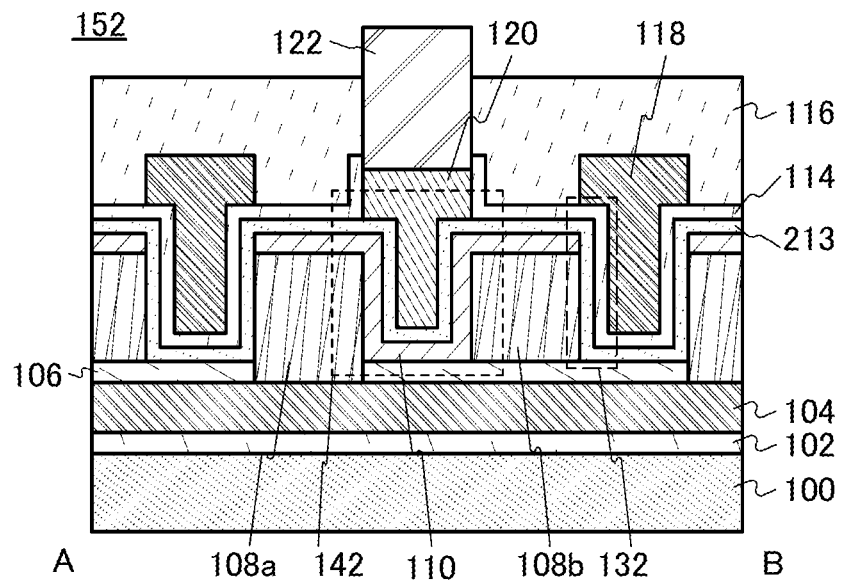

FIG. 12A    FIG. 12B
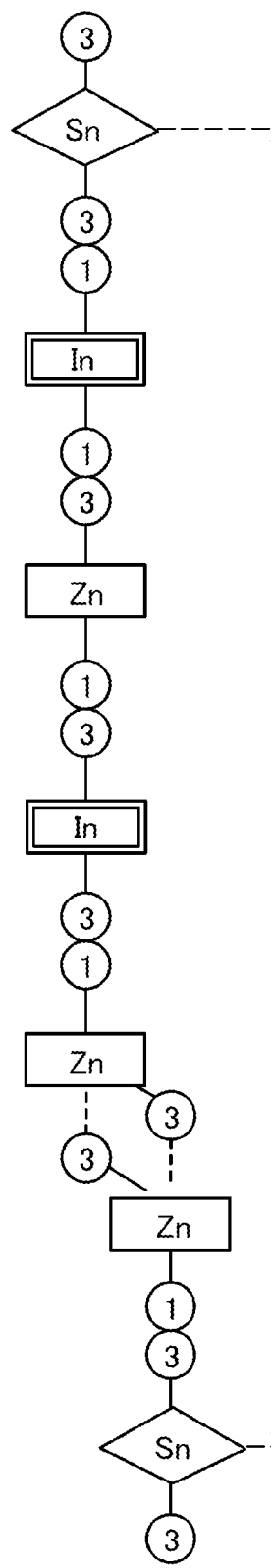
FIG. 12C
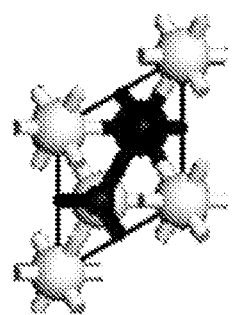
● In
☾ Sn
☽ Zn
• O

- In
- Ga
- Zn
- O

FIG. 14A $$\mu = \mu_0 \exp(-\frac{E}{kT})$$

FIG. 14B $$E = \frac{e^2 N^2}{8\varepsilon n} = \frac{e^3 N^2 t}{8\varepsilon C_{ox} V_g}$$

FIG. 14C $$I_d = \frac{W \mu V_g V_d C_{ox}}{L} \exp(-\frac{E}{kT})$$

FIG. 14D $$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g}$$

FIG. 14E $$\frac{1}{\mu_1} = \frac{1}{\mu_0} + \frac{D}{B} \exp\left(-\frac{x}{G}\right)$$

SEMICONDUCTOR MEMORY DEVICE

BACKGROUND OF THE INVENTION

1. Field of the Invention

The present invention relates to a semiconductor memory device which includes a circuit including a semiconductor element such as a transistor.

2. Description of the Related Art

A dynamic random access memory (DRAM) is a semiconductor memory device in which one bit of data can be stored with the use of one transistor and one capacitor. The DRAM has advantages such as a small area per unit memory cell, easiness in integration for modularization, and low manufacturing cost.

A circuit pattern of the DRAM has been miniaturized in accordance with a scaling law in a manner similar to those of other semiconductor integrated circuits. However, when an area occupied by a transistor is reduced, most part of the area of the DRAM is occupied by a capacitor, and it is difficult to reduce the area of the capacitor. This is because the miniaturization increases leakage between a source and a drain of the transistor and thus charge retained in the capacitor is gradually lost. In other words, the capacitor of the DRAM needs such a large capacitance that data is not changed by influence of charge which is lost due to the leakage.

Therefore, the DRAM needs to be charged again (refreshed) before necessary charge is lost. However, when the capacitance of the capacitor is reduced, there is a problem in that the frequency of refresh operations is increased, and as a result, power consumption is increased.

To solve such a problem, a DRAM is disclosed (see Patent Document 1). The DRAM includes a capacitor which has a small area and a large capacitance by forming a storage node electrode so as to pass a protruding end from the inner wall of a cylindrical side wall insulating film formed so as to protrude from a storage node contact.

However, when the DRAM having such a structure is manufactured, difficulty in the process might be increased due to its complicated structure and the yield might be lowered.

REFERENCE

Patent Document

[Patent Document 1] Japanese Patent Published Application No. H05-145036

SUMMARY OF THE INVENTION

To retain data, a conventional DRAM needs to perform refresh operations at an interval of several tens of milliseconds, which results in large power consumption. In addition, a transistor therein is frequently turned on and off; thus, deterioration of the transistor is also a problem. This problem becomes significant as the transistor is further miniaturized and the storage capacity is further increased.

Thus, an object is to provide a semiconductor memory device with low power consumption, in which the frequency of refresh operations for retaining data in a DRAM can be reduced.

Another object is to provide a highly integrated semiconductor memory device by reducing the area occupied by a capacitor in a DRAM.

One embodiment of the present invention is a semiconductor memory device including a bit line, a word line, a transistor, and a capacitor. The transistor includes a pair of electrodes; an oxide semiconductor film in contact with at least both top surfaces of the pair of electrodes; a first insulating film in contact with at least a top surface of the oxide semiconductor film; and a gate electrode which overlaps with the oxide semiconductor film with the first insulating film provided therebetween. The transistor is provided in a mesh of a netlike conductive film when seen from the above. Here, the capacitor includes one of the pair of electrodes, the netlike conductive film, and a second insulating film. Note that in the case where the first insulating film does not cover side surfaces of the pair of electrodes, the second insulating film is provided to cover the side surfaces of the pair of electrodes.

"Netlike" refers to a shape in which conductive films and the like are vertically and horizontally crossed. In addition, the "mesh" refers to an interstice in the shape in which the conductive films are vertically and horizontally crossed.

Note that the "pair of capacitor electrodes" refers to a pair of electrodes which form the capacitance of the capacitor. In addition, the "dielectric film" refers to a film which is positioned between the pair of capacitor electrodes of the capacitor, and is polarized when voltage is applied between the pair of capacitor electrodes.

The pair of electrodes functions as a source electrode and a drain electrode of the transistor. Further, the first insulating film functions as a gate insulating film of the transistor.

The gate electrode is connected to the word line, the other of the pair of electrodes is connected to the bit line, and the netlike conductive film is grounded (GND).

In addition, a third insulating film which fills a space between the pair of electrodes may be provided. "The third insulating film filling a space between the pair of electrodes is provided" can also be referred to as "the third insulating film is provided in a region which is sandwiched between the pair of electrodes". When the third insulating film is provided, since the oxide semiconductor film and the first insulating film do not need to be provided so as to be beyond steps formed by the pair of electrodes, coverage with the oxide semiconductor film and the first insulating film is increased, so that leakage current generated between the gate electrode and the pair of electrodes can be reduced. However, when the third insulating film is not provided, leakage current is not necessarily generated between the gate electrode and the pair of electrodes. The coverage with the oxide semiconductor film and the first insulating film depends on their deposition methods and the shape of the pair of electrodes. For example, when the pair of electrodes has tapered angles, the coverage with the oxide semiconductor film and the first insulating film at the steps formed by the pair of electrodes is increased in some cases.

Note that it is preferable that at least one of the first insulating film and the third insulating film is an insulating film which releases oxygen by heat treatment.

When oxygen is supplied from the first insulating film or the third insulating film to the oxide semiconductor film, an interface state density between the oxide semiconductor film and the first insulating film or the third insulating film can be reduced. As a result, carrier trapping, occurring due to operation of the transistor or the like, at the interface between the oxide semiconductor film and the first insulating film or the third insulating film can be suppressed, and thus, a transistor with less deterioration in electric characteristics can be obtained.

Further, in some cases, charge is generated due to oxygen vacancy in the oxide semiconductor film. In general, part of oxygen vacancy in an oxide semiconductor film serves as a donor and causes release of an electron which is a carrier. As a result, the threshold voltage of the transistor shifts in the negative direction. By supplying sufficient oxygen to the oxide semiconductor film from the first insulating film or the third insulating film, oxygen vacancy in the oxide semiconductor film which causes the shift of the threshold voltage in the negative direction can be reduced.

In the case where an insulating film which releases oxygen by heat treatment is used as at least one of the first insulating film and the third insulating film, an insulating which does not allow the released oxygen to pass therethrough (an insulating film having a small oxygen diffusion coefficient than the first insulating film or the third insulating film) is preferably used as the second insulating film. When the second insulating film has such a property, the amount of oxygen which is released from the first insulating film or the third insulating film and diffused to the outside of the semiconductor memory device can be reduced. Note that since the insulating film which releases oxygen by heat treatment is surrounded by the netlike conductive film in one embodiment of the present invention, when oxygen does not penetrate the netlike conductive film, the second insulating film is not necessarily provided.

For the oxide semiconductor film, a material having a bandgap of 2.5 eV or more, preferably 3.0 eV or more may be selected. With use of a material with a bandgap in the above range, the off-state current of the transistor can be reduced. Note that in one embodiment of the present invention, in place of the oxide semiconductor, a material having semiconductor characteristics and a bandgap within the above range may be applied.

It is preferable that the oxide semiconductor film is highly purified so as to contain as little impurities (such as hydrogen, an alkali metal, an alkaline earth metal, a rare gas, nitrogen, phosphorus, or boron) generating carriers directly or indirectly as possible. Furthermore, it is preferable to reduce oxygen vacancy as much as possible. By reducing impurities and oxygen vacancy in the oxide semiconductor film, generation of carriers in the oxide semiconductor film is suppressed, and the off-state current of the transistor can be reduced.

As described above, with the transistor with small off-state current, retention characteristic of charge accumulated in the capacitor in the DRAM can be improved. As a result, the frequency of refresh operations can be reduced.

Note that the netlike conductive film functions not only as the other of the capacitor electrodes but also as a guard ring. The function of the netlike conductive film as a guard ring can prevents electrostatic breakdown of every memory cell, so that a highly reliable DRAM with a high yield can be obtained.

In addition, according to one embodiment of the present invention, the capacitor can be formed along the side surface of the other of the pair of electrodes. The area of the side surface of the other of the pair of electrodes can be larger than the area of the top surface of the other of the pair of electrodes by controlling the thickness of the pair of electrodes. Accordingly, the area of the capacitor for obtaining a necessary capacitance can be reduced.

When the transistor with small off-state current is applied and the capacitance of the capacitor is increased, the frequency of refresh operations for retaining data in the DRAM is reduced. As a result, a semiconductor memory device with low power consumption is provided.

In addition, the capacitor of the DRAM is provided along the side surface of the other of the pair of electrodes of the transistor, whereby the capacitance of the capacitor can be increased and the area occupied by the capacitor can be reduced. As a result, a highly integrated semiconductor memory device can be provided.

In addition, the netlike conductive film which also serves as the capacitor electrode of the capacitor in the DRAM functions as a guard ring, whereby the electrostatic breakdown of every memory cell can be prevented. As a result, a highly reliable semiconductor memory device with a high yield can be provided.

BRIEF DESCRIPTION OF THE DRAWINGS

In the accompanying drawings:

FIGS. 2A and 2B are cross-sectional views each illustrating an example of a semiconductor memory device according one embodiment of the present invention;

FIGS. 12A to 12C are an example of an oxide semiconductor;

FIGS. 14A to 14E are formulae for calculating mobility;

DETAILED DESCRIPTION OF THE INVENTION

Figure 1A:
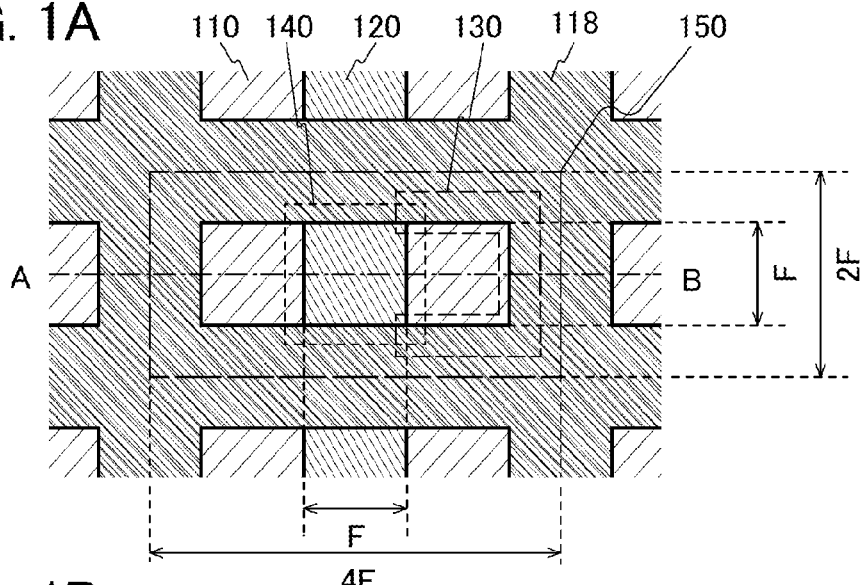
FIGS. 1A to 1C are a top view, a cross-sectional view, and a circuit diagram which illustrate an example of a semiconductor memory device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

In addition, a voltage refers to a potential difference between a given potential and a reference potential (e.g., a ground potential) in many cases. Accordingly, a voltage can also be called a potential. Even when a potential is represented as, for example, a potential VH, a potential VDD, or a potential GND, the potential is not exactly equal to the potential VH, the potential VDD, or the potential GND in some cases. Therefore, the potential VH, the potential VDD, and the potential GND can be referred to as a potential close to the potential VH, a potential close to the potential VDD, and a potential close to the potential GND, respectively. Note that "to be grounded" has the same meaning as "to be connected to GND".

Even when it is written in this specification that "to be connected", there is the case where no physical connection is made in an actual circuit and a wiring is only extended.

Note that the ordinal numbers such as "first" and "second" in this specification are used for convenience and do not denote the order of steps or the stacking order of layers. In addition, the ordinal numbers in this specification do not denote particular names which specify the present invention.

Note that in this specification, in referring to a specific row, a specific column, or a specific position in a matrix, a reference sign is accompanied by a sign denoting coordinates as follows, for example: "a transistor Tr_n_m", or "a bit line BL_m". In the case where a row, a column, or a position is not specified, the case where elements are collectively referred to, or the case where the position is obvious, the following expressions may be used: "a transistor Tr" and "a bit line BL", or simply "a transistor" and "a bit line".

Embodiment 1

In this embodiment, a semiconductor memory device to which one embodiment of the present invention is applied will be described.

Figure 1B:
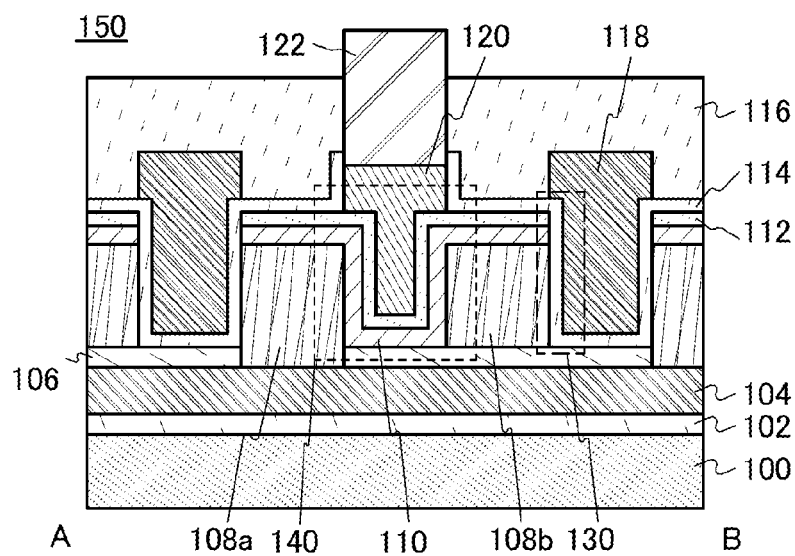
Figure 1C:
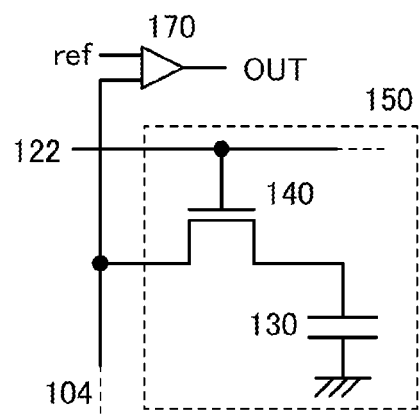

FIG. 1A is a top view illustrating part of a memory cell array that is a semiconductor memory device. FIG. 1B illustrates a cross section A-B along a dashed-dotted line A-B in FIG. 1A. In addition, FIG. 1C is a circuit diagram of a memory cell.

In FIG. 1A, a memory cell 150 includes a netlike conductive film 118, a transistor 140 including an oxide semiconductor, and a capacitor 130. Here, given that the minimum feature size is F, the size of the memory cell 150 is 2F×4F and the area thereof is $8F^2$.

The memory cell 150 is provided in a mesh of the netlike conductive film 118 when seen from the above. Therefore, the netlike conductive film 118 functions as a guard ring which prevents electrostatic breakdown of every memory cell.

Figure 3A:
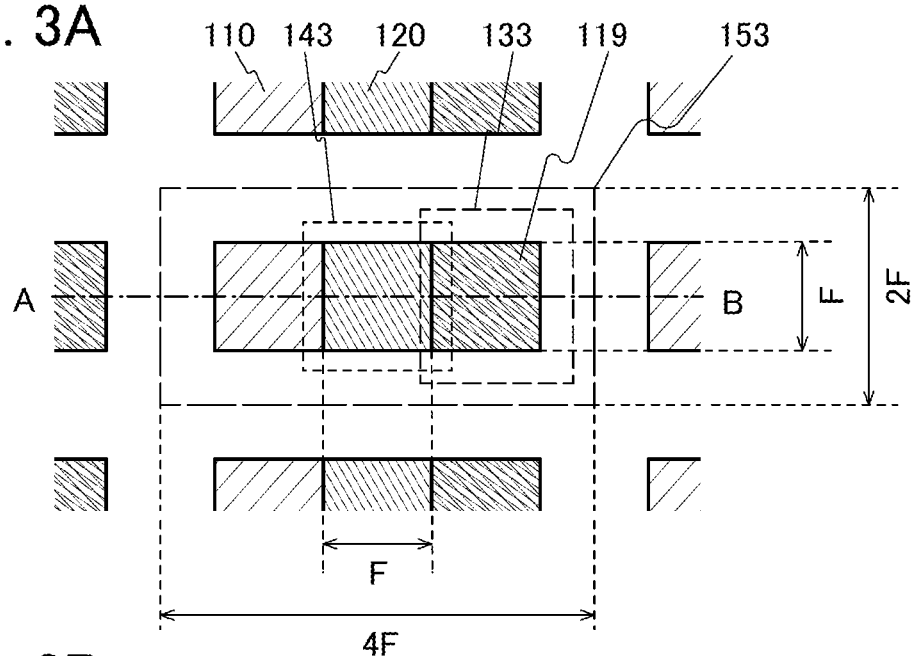
FIGS. 3A and 3B are a top view and a cross-sectional view which illustrate an example of a semiconductor memory device according to one embodiment of the present invention.
Figure 3B:
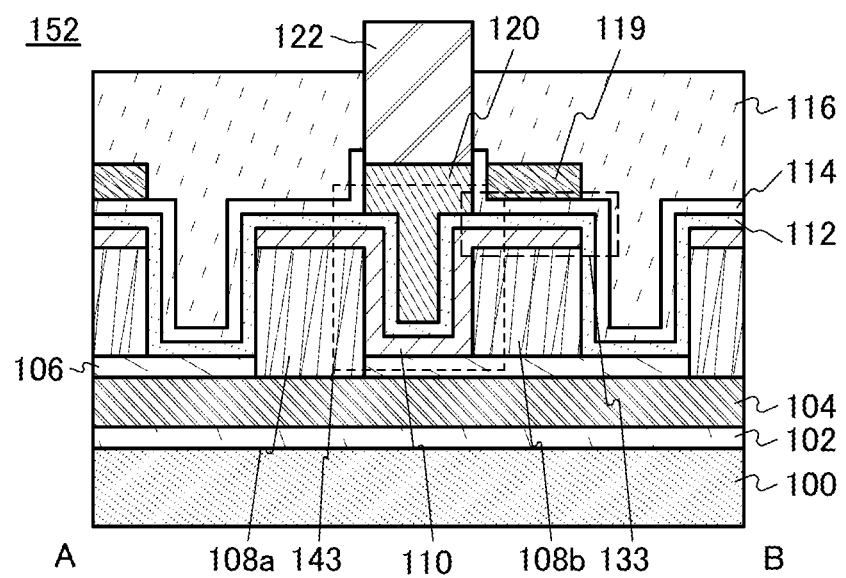

In addition, the netlike conductive film 118 functions as a capacitor electrode of the capacitor 130. Note that since the capacitor electrode has a net shape as illustrated in FIG. 1A, when the thickness of a drain electrode 108b is larger than one third of the width thereof, the surface area of the capacitor 130 can be large as compared to that of a capacitor 133 of a memory cell 153 illustrated in FIG. 3A while the memory cells 150 and 153 have the same area.

A specific structure of the memory cell 150 is described with reference to FIG. 1B.

The memory cell 150 includes a substrate 100, a first insulating film 102 provided over the substrate 100, a bit line 104 provided over the first insulating film 102, a second insulating film 106 provided over the bit line 104, the transistor 140 provided over the second insulating film 106 and including a source electrode 108a connected to the bit line 104 via an opening provided in the second insulating film 106, the capacitor 130 provided over the second insulating film 106, a fifth insulating film 116 provided to cover the transistor 140 and the capacitor 130, and a word line 122 connected to a gate electrode 120 of the transistor 140 via an opening provided in the fifth insulating film 116.

The transistor 140 included in the memory cell 150 includes the source electrode 108a, the drain electrode 108b which is provided to be apart from the source electrode 108a and formed in the same layer with the use of the same material as the source electrode 108a, an oxide semiconductor film 110 which is provided over and at least partly in contact with the source electrode 108a and the drain electrode 108b, a third insulating film 112 provided over at least the oxide semiconductor film 110, and the gate electrode 120 overlapping with the oxide semiconductor film 110 with the third insulating film 112 provided therebetween.

The capacitor 130 included in the memory cell 150 includes a dielectric film which includes a fourth insulating film 114 provided to cover the transistor 140, the netlike conductive film 118 which is provided to surround the transistor 140 when seen from the above, and a pair of capacitor electrodes including the drain electrode 108b.

Although each layer does not have a taper angle in FIG. 1B for simplification, this embodiment is not limited thereto, and each layer may have a taper angle.

In this specification, the phrase "A is provided to cover B" means that A covers a side surface and a top surface of B. In addition, a case where C which is different from A and B is provided between A and B can also be represented as "A is provided to cover B". Note that C may be formed with a single layer or a stake of layers.

Further, in this specification, the phrase "B which is provided over A" means at least that B is provided to be partly in contact with a top surface of A. In a similar manner, the phrase "B which overlaps with A" means that B is provided to partly or entirely overlap with A in a top view.

Next, the circuit configuration of the memory cell 150 is described with reference to FIG. 1C.

In the memory cell 150, a source of the transistor 140 is connected to the bit line 104, a gate of the transistor 140 is connected to the word line 122, a drain of the transistor 140 is connected to one of the pair of capacitor electrodes of the capacitor 130, and the other of the pair of capacitor electrodes of the capacitor 130 is connected to GND.

The bit line 104 is connected to a sense amplifier 170.

The attention is focused on this memory cell and a method for reading data and a method for reading out data are described below.

First, a writing method is described. For example, when the bit line 104 is set to a predetermined potential VDD (a potential high enough to charge a capacitor) and the word line 122 is set to a predetermined potential VH (a potential which is higher than the sum of a threshold voltage (Vth) of the transistor 140 and VDD), the capacitor 130 is charged with VDD. Next, when the potential of the word line 122 is set to GND (or less than GND), charge corresponding to Data 1 is retained in the capacitor 130. This is a writing method for Data 1.

In a similar manner, when the potential of the bit line 104 is set to GND and the word line 122 is set to the predetermined potential VH, the capacitor 130 is not charged. Next, when the potential of the word line 122 is set to GND (or less than GND), Data 0 is retained in the capacitor 130. This is a writing method for Data 0.

Data written in the above manner can be retained for a very long time because the off-state current of the transistor 140 is small.

Note that by utilizing the small off-state current of the transistor 140, a multi-valued memory cell 150 may be employed. In this case, data can be distinguished by the value of a potential retained in the capacitor 130.

Next, a method for reading out data is described. First, the bit line 104 is set to a predetermined potential (fixed potential). Next, the word line 122 is set to VH, whereby a potential corresponding to data written in the capacitor 130 is applied to the bit line 104. The applied potential is read out by the sense amplifier 170. Not that the data is lost instantaneously after being read out. Therefore, the data needs to be written again after the reading operation. This is the method for reading out data.

Note that a memory cell array including a plurality of memory cells 150 will be described later and thus is not described here.

The thickness of the oxide semiconductor film 110 is greater than or equal to 1 nm and less than or equal to 40 nm, preferably greater than or equal to 5 nm and less than or equal to 15 nm. In particular, in the case of a transistor whose channel length is less than or equal to 30 nm, when the thickness of the oxide semiconductor film 110 is set to approximately 5 nm, a short-channel effect can be suppressed and the transistor can have stable electric characteristics.

The oxide semiconductor film 110 preferably contains at least indium (In) or zinc (Zn). In particular, the oxide semiconductor film 110 preferably contains In and Zn. As a stabilizer for reducing the variations in electric characteristics of the transistor, the oxide semiconductor film 110 preferably contains gallium (Ga) in addition to In and Zn. In addition, the oxide semiconductor film 110 preferably contains tin (Sn), hafnium (Hf), or aluminum (Al) as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an In—Ga—Zn-based oxide means an oxide containing In, Ga, and Zn as its main component, in which there is no particular limitation on the ratio of In:Ga:Zn. The In—Ga—Zn-based oxide may contain a metal element other than the In, Ga, and Zn.

In the case where an In—Zn-based oxide material is used for the oxide semiconductor film 110, any of the following is employed: In/Zn is 0.5 to 50 in an atomic ratio, preferably In/Zn is 1 to 20 in an atomic ratio, or further preferably In/Zn is 1.5 to 15 in an atomic ratio. When the atomic ratio of Zn is in the above range, the field-effect mobility of the transistor can be improved. Here, when the atomic ratio of the compound is In:Zn:O=X:Y:Z, the relation of $Z>1.5X+Y$ is preferably satisfied.

Alternatively, a material represented by a chemical formula, $InMO_3(ZnO)_m$ (m>0) may be used for the oxide semiconductor film 110. Here, M represents one or more metal elements selected from Ga, Al, Fe, Mn, and Co. As the oxide semiconductor, a material expressed by $In_3SnO_5(ZnO)_n$ (n>0) may also be used.

For example, an In—Ga—Zn-based oxide with an atomic ratio of In:Ga:Zn=1:1:1 or In:Ga:Zn=2:2:1, or an oxide with an atomic ratio close to the above atomic ratios can be used. Alternatively, an In—Sn—Zn-based oxide with an atomic ratio of In:Sn:Zn=1:1:1, In:Sn:Zn=2:1:3, or In:Sn:Zn=2:1:5, or an oxide with an atomic ratio close to the above atomic ratios may be used.

For example, high field-effect mobility can be obtained relatively easily in the case of a transistor using an In—Sn—Zn-based oxide. Also in the case of the transistor using an In—Ga—Zn-based oxide, the field-effect mobility can be increased by reducing the defect density in the bulk.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

As for the oxide semiconductor film 110, a material which has a bandgap of 2.5 eV or more, preferably has a bandgap of 3.0 eV or more, is selected in order to reduce the off-state current of the transistor. Note that a material having semiconductor characteristics whose band gap is within the above range which is not an oxide semiconductor may also be used.

The oxide semiconductor film 110 is an oxide semiconductor film in which hydrogen, an alkali metal, an alkaline earth metal, and the like are reduced and whose concentration of impurities is very low. Therefore, in the transistor whose channel region is formed using the oxide semiconductor film 110, off-state current can be reduced.

The hydrogen concentration in the oxide semiconductor film 110 is lower than $5\times10^{19}$ cm$^{-3}$, preferably lower than or equal to $5\times10^{18}$ cm$^{-3}$, more preferably lower than or equal to $1\times10^{18}$ cm$^{-3}$, still more preferably lower than or equal to $5\times10^{17}$ cm$^{-3}$.

Alkali metal is not an element included in an oxide semiconductor, and therefore, is an impurity. Also, alkaline earth metal is impurity in the case where alkaline earth metal is not included in an oxide semiconductor. An alkali metal, in particular, sodium (Na) diffuses in an insulating film to become Na$^+$. In addition, in the oxide semiconductor film, Na cuts or enters a bond between a metal and oxygen which are included in the oxide semiconductor. As a result, for example, deterioration of characteristics of the transistor, such as a normally-on state of the transistor due to shift of a threshold voltage in the negative direction, or a reduction in field-effect mobility, occurs; in addition, a variation in characteristics is also caused. Such deterioration of characteristics of the transistor and variation in characteristics due to the impurity frequently appear when the concentration of hydrogen in the oxide semiconductor film is sufficiently low. Therefore, when the hydrogen concentration in the oxide semiconductor film is lower than or equal to $1\times10^{18}$ cm$^{-3}$, in particular, lower than or equal to $1\times10^{17}$ cm$^{-3}$, the concentration of the impurity is preferably reduced. Specifically, the measurement value of Na concentration is lower than or equal to $5\times10^{16}$ cm$^{-3}$, preferably lower than or equal to $1\times10^{16}$ cm$^{-3}$, more preferably lower than or equal to $1\times10^{15}$ cm$^{-3}$. In addition, the measurement value of lithium (Li) concentration is preferably lower than or equal to $5\times10^{15}$ cm$^{-3}$, more preferably lower than or equal to $1\times10^{15}$ cm$^{-3}$. In addition, the measurement value of potassium (K) concentration is lower than or equal to $5\times10^{15}$ cm$^{-3}$, preferably lower than or equal to $1\times10^{15}$ cm$^{-3}$.

By using the oxide semiconductor film 110 described above, the off-state current of the transistor can be reduced. For example, the off-state current of the transistor where the channel length is 3 μm and the channel width is 1 μm can be less than or equal to $1\times10^{-18}$ A, less than or equal to $1\times10^{-21}$ A, or less than or equal to $1\times10^{-24}$ A. Therefore, a memory cell with excellent data retention characteristics and low power consumption can be manufactured.

The oxide semiconductor film 110 is in a single crystal state, a polycrystalline (also referred to as polycrystal) state, an amorphous state, or the like.

The oxide semiconductor film 110 is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a top surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a top surface side of the oxide semiconductor film, the proportion of crystal parts in the vicinity of the top surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a top surface of the CAAC-OS film, the directions of the c-axes may be different from each other depending on the shape of the CAAC-OS film (the cross-sectional shape of the surface where the CAAC-OS film is formed or the cross-sectional shape of the top surface of the CAAC-OS film). Note that when the CAAC-OS film is formed, the direction of c-axis of the crystal part is the direction parallel to a normal vector of the surface where the CAAC-OS film is formed or a normal vector of the top surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The CAAC-OS film is easily formed when a film serving as a base of the CAAC-OS film is flat. Specifically, the film serving as a base is formed to have an average surface roughness (Ra) of 1 nm or less, preferably 0.3 nm or less. Note that $R_a$ is obtained by expanding centerline average roughness, which is defined by JIS B 0601, into three dimensions so as to be applicable to a surface. Moreover, $R_a$ can be expressed as average value of the absolute values of deviations from a reference surface to a specific surface and is defined by Formula 1.

[Formula 1]

$$Ra = \frac{1}{S_0} \int_{y_1}^{y_2} \int_{x_1}^{x_2} |f(x,y) - Z_0| \, dx \, dy \qquad (1)$$

Note that, in Formula 1, $S_0$ represents the area of a measurement surface (a rectangular region which is defined by four points represented by the coordinates $(x_1,y_1)$, $(x_1,y_2)$, $(x_2,y_1)$, and $(x_2,y_2)$), and $Z_0$ represents average height of the measurement surface. Ra can be measured using an atomic force microscope (AFM).

The crystalline parts included in the CAAC-OS film will be described in Embodiment 6.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like; a compound semiconductor substrate made of silicon germanium or the like; a silicon-on-insulator (SOI) substrate; or the like may be used as the substrate 100. Still alternatively, any of these substrates further provided with a semiconductor element is preferably used as the substrate 100.

Further alternatively, a flexible substrate may be used as the substrate 100. In that case, a transistor is manufactured directly on the flexible substrate. As a method for forming a transistor on a flexible substrate, a method may be employed in which after the transistor is formed over a non-flexible substrate, the transistor is separated and transferred to the substrate 100 that is a flexible substrate. In that case, a separation layer is preferably provided between the non-flexible substrate and the transistor.

The first insulating film 102 may be formed with a single layer or a stack of layers using one or more kinds of materials selected from silicon oxide, silicon oxynitride, silicon nitride oxide, silicon nitride, aluminum oxide, aluminum nitride, hafnium oxide, zirconium oxide, yttrium oxide, lanthanum oxide, tantalum oxide, and magnesium oxide.

The bit line 104 may be formed with a single layer or a stack of layers using one or more kinds of materials selected from the following: Al, Ti, Cr, Co, Ni, Cu, Y, Zr, Mo, Ag, Ta, and W; a nitride of any of these elements; an oxide of any of these elements; and an alloy of any of these elements. Note that the bit line 104 is provided to be parallel to the longitudinal direction of the memory cell 150.

The second insulating film 106 may be formed using a method and a material that are similar to those of the first insulating film 102.

The source electrode 108a and the drain electrode 108b may be formed using a method and a material that are similar to those of the bit line 104. Although the source electrode 108a and the drain electrode 108b are illustrated so as to have different thicknesses in FIG. 1B, this is an expression for easy understanding of the drawing. Therefore, the source electrode 108a and the drain electrode 108b may have the same thickness.

The capacitor 130 is provided along a side surface of the drain electrode 108b. Therefore, as the thickness of the drain electrode 108b becomes larger, the capacitance of the capacitor 130 is increased. However, when the thickness of the drain electrode 108b becomes too large, coverage with a layer to be formed later might be lowered. Therefore, the thickness of the drain electrode 108b is greater than or equal to one-third times and less than or equal to ten times as large as the minimum feature size F, preferably greater than or equal to 1 time and less than or equal to 4 times as large as the minimum feature size F.

The third insulating film 112 may be formed using a method and a material that are similar to those of the first insulating film 102.

At least one of the second insulating film 106 and the third insulating film 112 is preferably formed using an insulating film which releases oxygen by heat treatment. The use of a film which releases oxygen by heat treatment makes it possible to repair defects generated in the oxide semiconductor film 110 and the vicinity of an interface between the film and the oxide semiconductor film 110; thus, deterioration in electric characteristics of the transistor can be suppressed.

To release oxygen by heat treatment means that the released amount of oxygen which is converted to oxygen atoms is greater than or equal to $1.0 \times 10^{18}/cm^{-3}$, in particular, greater than or equal to $3.0 \times 10^{20}/cm^{-3}$ in thermal desorption spectroscopy (TDS).

Here, a method to measure the amount of released oxygen using TDS analysis is described.

The total amount of the gas which is released at the time of TDS analysis is proportional to an integral value of the ion intensity of the released gas. Then, the integral value is compared with that of a reference sample, whereby the total amount of the gas which is released can be calculated.

For example, the number of released oxygen molecules ($N_{O2}$) from an insulating film can be found according to an Formula 2 with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal $$N_{O2}=N_{H2}/S_{H2} \times S_{O2} \times \alpha \quad (2)$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Refer to Japanese Published Patent Application No. H6-275697 for details of Formula 2. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/$cm^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heat treatment may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

When oxygen is supplied from the second insulating film 106 and the third insulating film 112 to the oxide semiconductor film 110, the interface state density between the oxide semiconductor film 110 and the second insulating film 106 and the interface state density between the oxide semiconductor film 110 and the third insulating film 112 can be reduced. As a result, carrier trapping, occurring due to the operation of the transistor or the like, at the interface between the oxide semiconductor film 110 and the second insulating film 106 and the interface between the oxide semiconductor film 110 and the third insulating film 112 can be suppressed, and thus, a transistor with less deterioration in electric characteristics can be obtained.

Further, in some cases, charge is generated due to oxygen vacancy in the oxide semiconductor film 110. In general, part of oxygen vacancy in an oxide semiconductor film serves as a donor and causes release of an electron which is a carrier. As a result, the threshold voltage of a transistor shifts in the negative direction. By supplying sufficient oxygen to the oxide semiconductor film 110 from the second insulating film 106 and the third insulating film 112, the oxygen vacancy in the oxide semiconductor film which causes the shift of the threshold voltage in the negative direction can be reduced.

The gate electrode 120 may be formed using a method and a material that are similar to those of the bit line 104.

As the fourth insulating film 114, a material which has smaller oxygen diffusion coefficient than the second insulating film 106 and the third insulating film 112 at temperatures higher than or equal to 250° C. and lower than or equal to 450° C. may be used. When oxygen is released from the second insulating film 106 and the third insulating film 112, such a structure makes it possible to reduce the amount of oxygen which is diffused to the outside of the memory cell 150.

Note that a material of the fourth insulating film 114 can be selected appropriately from materials which are described as the materials of the second insulating film 106 and the third insulating film 112. However, a material which has smaller oxygen diffusion coefficient than the materials selected as the materials of the second insulating film 106 and the third insulating film 112 at temperatures higher than or equal to 250° C. and lower than or equal to 450° C. is used. For example, in the case where silicon oxide films are used as the second insulating film 106 and the third insulating film 112, an aluminum oxide film may be used as the fourth insulating film 114. Not only oxygen but also water does not easily penetrate an aluminum oxide film. Therefore, the entrance of water from the outside of the transistor 140 can be prevented, so that the reliability of the semiconductor memory device can be increased. The aluminum oxide film may be formed to a thickness greater than or equal to 5 nm and less than or equal to 200 nm, preferably greater than or equal to 20 nm and less than or equal to 100 nm.

The netlike conductive film 118 may be formed using a method and a material that are similar to those of the bit line 104.

The fifth insulating film 116 may be formed using a method and a material that are similar to those of the first insulating film 102. The fifth insulating film 116 may be formed using a resin material, e.g., a polyimide film, an acrylic film, or an epoxy film and formed with a single layer or a stack of layers. The fifth insulating film 116 preferably has, but not limited thereto, a flat top surface. Projections and depressions due to the shape of a base may be formed in the top surface of the fifth insulating film 116.

The word line 122 may be formed using a method and a material that are similar to those of the bit line 104. The word line 122 is connected to the gate electrode 120 through an opening provided in the fifth insulating film 116 and the fourth insulating film 114. Note that the word line 122 is provided to be orthogonal to the bit line 104.

The capacitor 130 is formed along the side surface of the drain electrode 108b in the memory cell 150 described above and thus can have a large capacitance.

In addition, the netlike conductive film 118 is provided to surround the memory cell 150, and thus can obtain an effect of a guard ring to prevent the electrostatic breakdown of the memory cell 150.

Next, a method for manufacturing the memory cell 150 illustrated in FIGS. 1A to 1C is described with reference to FIGS. 4A to 4C, FIGS. 5A and 5B, FIGS. 6A to 6C, and FIGS. 7A to 7C.

Figure 4A:
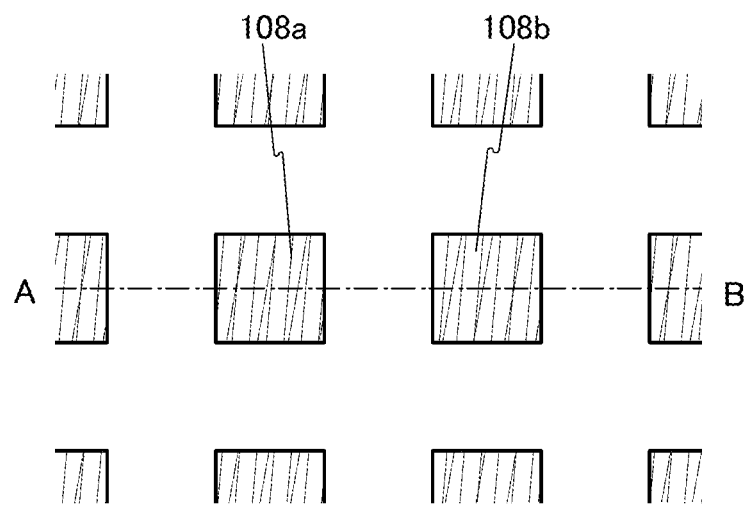
FIGS. 4A to 4C are a top view and cross-sectional views which illustrate an example of a method for manufacturing a semiconductor memory device according to one embodiment of the present invention.
Figure 4B:
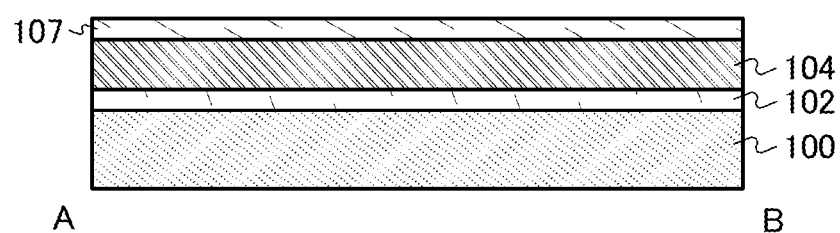
Figure 4C:
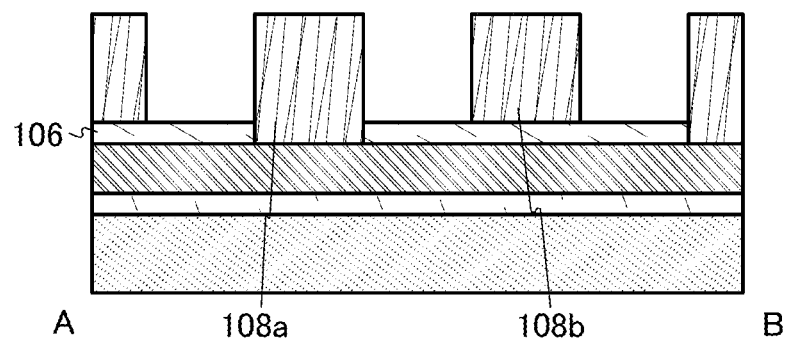

First, the first insulating film 102, the bit line 104, and a second insulating film 107 are formed in this order over the substrate 100 (see FIG. 4B). Note that a semiconductor element may be additionally provided over the substrate 100, and the first insulating film 102, the bit line 104, and the second insulating film 107 may be formed when the semiconductor element is formed. The first insulating film 102 is deposited by a sputtering method, an evaporation method, a plasma chemical vapor deposition method (PCVD method), a pulsed laser deposition method (PLD method), an atomic layer deposition method (ALD method), a molecular beam epitaxy method (MBE method), or the like. Note that the first insulating film 102 may be formed by a thermal oxidation method depending on the material of the substrate 100.

Next, a resist mask is formed over the second insulating film 107 by a photolithography method, and processing is performed using the resist mask to form the second insulating film 106 having the opening from which the bit line 104 is exposed. Then, a conductive film is deposited by a sputtering method, an evaporation method, a PCVD method, a PLD method, an ALD method, an MBE method, or the like, a resist mask is formed by a photolithography method, and the source electrode 108a connected to the bit line 104 and the drain electrode 108b are formed using the resist mask (see FIG. 4C). A top view at this stage is illustrated in FIG. 4A.

Figure 5A:
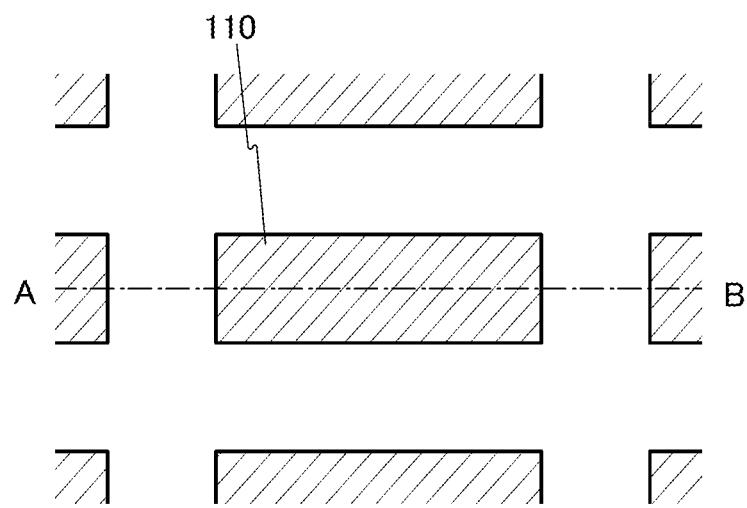
FIGS. 5A and 5B are a top view and a cross-sectional view which illustrate an example of a method for manufacturing a semiconductor memory device according to one embodiment of the present invention.
Figure 5B:
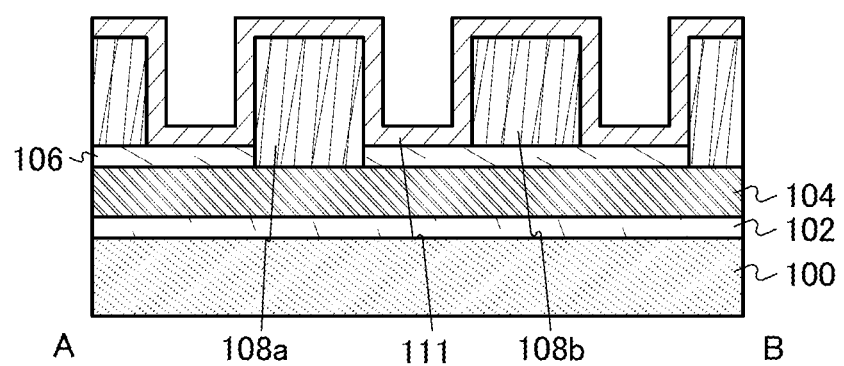

Then, an oxide semiconductor film 111 is deposited by a sputtering method, an evaporation method, a PCVD method, a PLD method, an ALD method, an MBE method, or the like (see FIG. 5B). At this step, when the oxide semiconductor film 111 is deposited while heat treatment is performed at a temperature higher than or equal to 250° C. and lower than or equal to 450° C., a CAAC-OS film is easily formed. Alternatively, after the oxide semiconductor film 111 is deposited, heat treatment may be performed at a temperature higher than or equal to 450° C. and lower than the strain point of the substrate, preferably higher than or equal to 600° C. and lower than or equal to 700° C. A top view at this stage is illustrated in FIG. 5A.

For example, in the case where the oxide semiconductor film 111 is deposited by a sputtering method, a deposition chamber in which the oxide semiconductor film 111 is deposited is preferably evacuated using a rough vacuum pump such as a dry pump and a high vacuum pump such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of a cryopump having a high capability in evacuating water and a sputter ion pump having a high capability in evacuating hydrogen is effective.

An adsorbate inside the deposition chamber in which the oxide semiconductor film 111 is deposited does not affect the pressure in the deposition chamber because it is adsorbed, but leads to release of gas at the time of the evacuation of the deposition chamber. Therefore, it is important that the adsorbate inside the deposition chamber is desorbed as much as possible and evacuation is performed in advance with the use of a pump having high evacuation capability. Note that the deposition chamber may be subjected to baking for promotion of desorption of the adsorbate. By the baking, the rate of desorption of the adsorbate can be increased about tenfold. The baking may be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased. Note that the rate of desorption of the adsorbate can be further increased by heating of the inert gas to be introduced at substantially the same temperature as the temperature of the baking. In addition, the rate of desorption of the adsorbate can be further increased also by dummy deposition performed at the same time as the baking. Here, the dummy deposition refers to deposition on a dummy substrate by sputtering, in which a film is deposited on the dummy substrate and the inner wall of a deposition chamber so that impurities in the deposition chamber and an adsorbate on the inner wall of the deposition chamber are confined in the film. For the dummy substrate, a material from which a small amount of gas is released is preferably used, and for example, the same material as that of the substrate 100 may be used.

In addition, when a deposition gas whose dew point is lower than or equal to −95° C., preferably lower than or equal to −110° C. is used, the hydrogen concentration in the oxide semiconductor film 111 can be reduced.

When the oxide semiconductor film 111 is deposited in this manner, the entrance of hydrogen into the oxide semiconductor film 111 can be suppressed. In addition, when a film in contact with the oxide semiconductor film 111 is deposited using the same deposition chamber, the entrance of hydrogen from the film in contact with the oxide semiconductor film 111 into the oxide semiconductor film 111 can be suppressed. Consequently, a transistor with high reliability and less variation in electrical characteristics can be manufactured.

Next, a third insulating film is deposited. Then, a resist mask is formed over the third insulating film by a photolithography method, and processing is performed using the resist mask to form the third insulating film 112 and the oxide semiconductor film 110 (see FIG. 6B). The oxide semiconductor film 110 is in contact with at least a top surface of the source electrode 108a, a side surface of the source electrode 108a which faces the drain electrode 108b, part of a top surface of the second insulating film 106 which is located between the source electrode 108a and the drain electrode 108b, a top surface of the drain electrode 108b, and a side surface of the drain electrode 108b which faces the source electrode 108a.

Figure 6A:
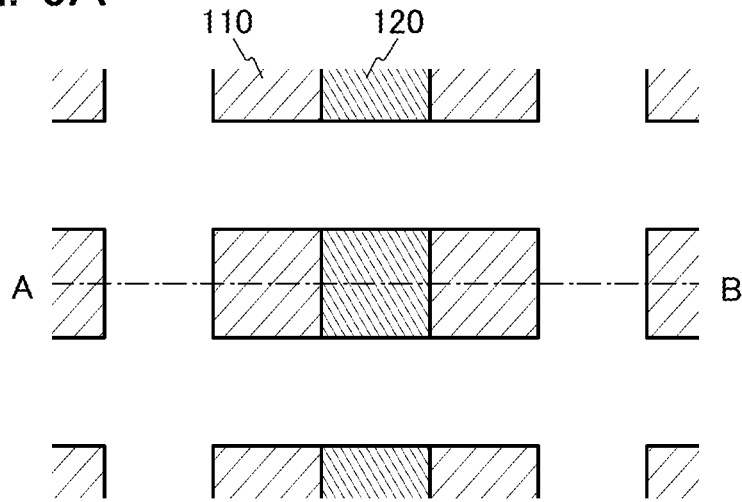
FIGS. 6A to 6C are a top view and cross-sectional views which illustrate an example of a method for manufacturing a semiconductor memory device according to one embodiment of the present invention.
Figure 6B:
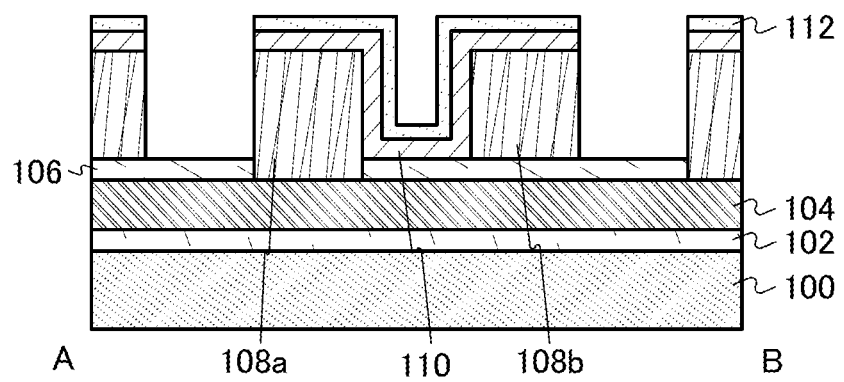
Figure 6C:
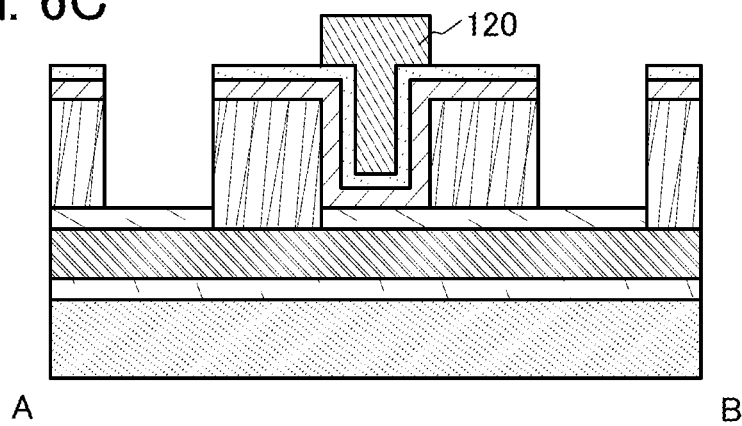

Next, a conductive film is deposited by a sputtering method, an evaporation method, a PCVD method, a PLD method, an ALD method, an MBE method, or the like, a resist mask is formed by a photolithography method, and the gate electrode 120 is formed using the resist mask (see FIG. 6C). A top view at this stage is illustrated in FIG. 6A.

Figure 7A:
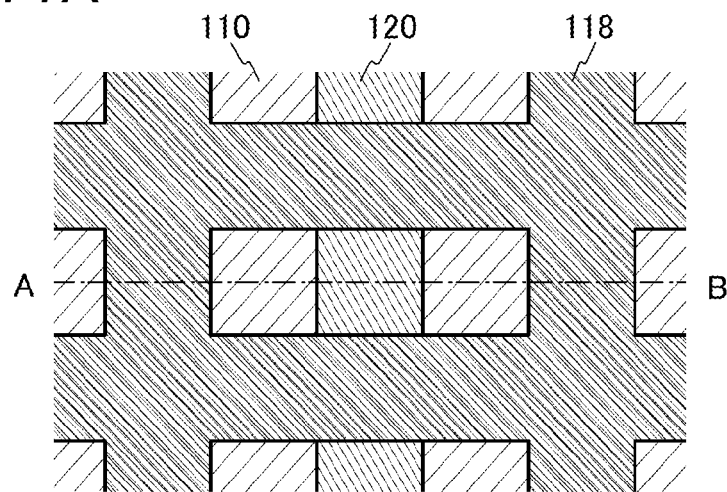
FIGS. 7A to 7C are a top view and cross-sectional views which illustrate an example of a method for manufacturing a semiconductor memory device according to one embodiment of the present invention.
Figure 7B:
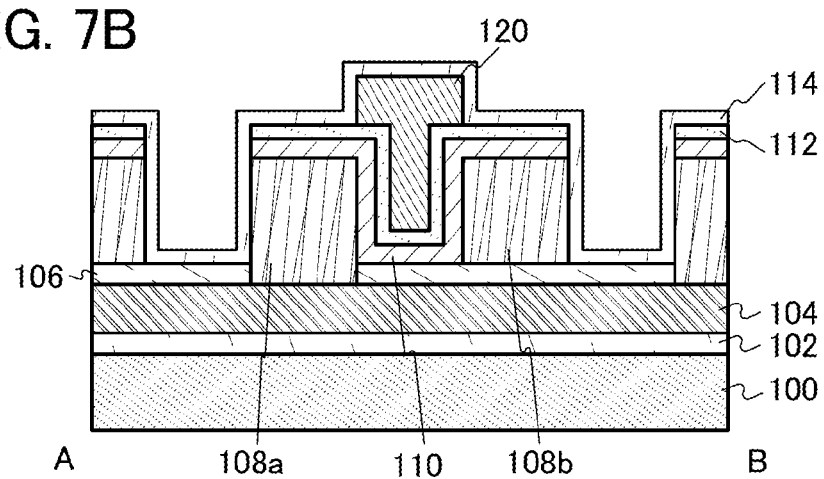

Then, the fourth insulating film 114 is deposited (see FIG. 7B).

Figure 7C:
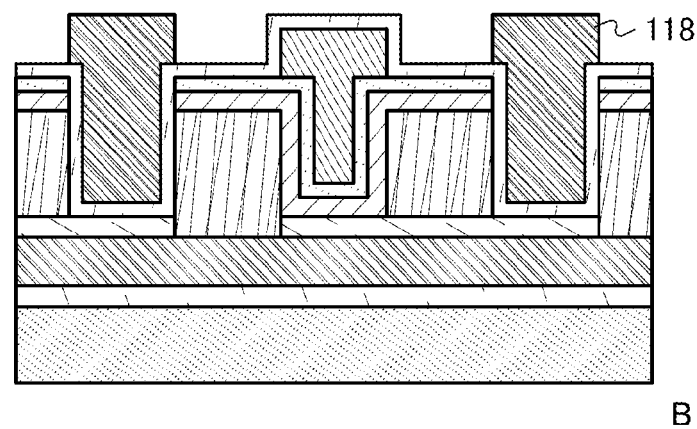

Subsequently, the netlike conductive film 118 is formed (see FIG. 7C). A top view at this stage is illustrated in FIG. 7A.

Next, the fifth insulating film 116 is formed. Then, the word line 122 which is connected to the gate electrode 120 through the opening provided in the fifth insulating film 116 is formed over the fifth insulating film 116. Through the above steps, the memory cell 150 illustrated in FIGS. 1A to 1C can be manufactured.

Note that heat treatment is preferably performed with at least any of the following timings: after the deposition of the oxide semiconductor film 111; after the formation of the third insulating film to be the third insulating film 112; after the deposition of the fourth insulating film 114. By the heat treatment, oxygen is released from the second insulating film 106 or the third insulating film (or the third insulating film 112), and oxygen vacancy in the oxide semiconductor film 111 (or the oxide semiconductor film 110) or in the vicinity of the interface of the oxide semiconductor film 111 (or the oxide semiconductor film 110) can be reduced. The heat treatment may be performed at a temperature higher than or equal to 250° C. and lower than or equal to 450° C. Note that heat treatment similar thereto may be performed after the memory cell 150 is manufactured.

Note that plasma treatment such as reverse sputtering treatment may be performed on the source electrode 108a and the drain electrode 108b. When such treatment is performed, a top edge portion of the source electrode 108a and a top edge portion of the drain electrode 108b each can have a curved shape, and coverage with the oxide semiconductor film 110, the third insulating film 112, the gate electrode 120, and the netlike conductive film 118 which are formed later can be improved.

In the memory cell 150 manufactured as described above, the frequency of refresh operations for retaining data in the DRAM can be reduced owing to the transistor 140 having small off-state current and the capacitor 130 having a small area and a large capacitance, so that power consumption can be reduced.

In addition, when the netlike conductive film 118 is provided, the electrostatic breakdown of the memory cell 150 can be prevented and the yield and the reliability can be improved.

This embodiment can be implemented in appropriate combination with any of the other embodiments.

Embodiment 2

In this embodiment, memory cells having different structures from the memory cell 150 described in Embodiment 1 will be described with reference to FIGS. 2A and 2B.

A memory cell 151 illustrated in FIG. 2A is different from the memory cell 150 in that a sixth insulating film 224 which fills a space between the source electrode 108a and the drain electrode 108b is included.

Note that a capacitor 131 has the same structure as the capacitor 130.

When the sixth insulating film 224 is provided, a transistor 141 has a different shape from the transistor 140. Specifically, an oxide semiconductor film 210, a third insulating film 212, and a gate electrode 220 are provided without the oxide semiconductor film 110, the third insulating film 112, and the gate electrode 120. Here, the sixth insulating film 224 allows the structure in which the oxide semiconductor film 210, and the third insulating film 212, and the gate electrode 220 are not formed on steps formed by the source electrode 108a and the drain electrode 108b. Therefore, a structure which prevents leakage current and disconnection due to the steps can be obtained. As a result, the yield of a semiconductor memory device can be improved.

The sixth insulating film 224 may be formed using a method and a material that are similar to those of the first insulating film 102. In addition, when an insulating film which releases oxygen by heat treatment is used as the sixth insulating film 224, the transistor 141 with less deterioration in electric characteristics can be obtained.

The oxide semiconductor film 210 may be formed using a method and a material that are similar to those of the oxide semiconductor film 110, and the gate electrode 220 may be formed using a method and a material that are similar to those of the gate electrode 120.

A memory cell 152 illustrated in FIG. 2B is different from the memory cell 150 in that a third insulating film 213 is provided over the entire surface.

A transistor 142 has the same structure as the transistor 140.

When the third insulating film 213 is provided over the entire surface, oxygen can also be supplied to a side surface of the oxide semiconductor film 110 from the third insulating film 213. Therefore, leakage current flowing through the side surface of the oxide semiconductor film 110 can be reduced, so that the off-state current of the transistor can be reduced. In addition, leakage current from a capacitor 132 can be reduced. As a result, the yield of the semiconductor memory device can be improved.

The third insulating film 213 may be formed using a method and a material that are similar to those of the third insulating film 112.

Note that the sixth insulating film 224 may be provided in FIG. 2B.

According to this embodiment, the semiconductor memory device with a high yield as compared to that of Embodiment 1 can be obtained.

This embodiment can be implemented in appropriate combination with any of the other embodiments.

Embodiment 3

In this embodiment, a memory cell array in which a plurality of memory cells described in Embodiment 1 or Embodiment 2 is provided will be described.

Figure 8:
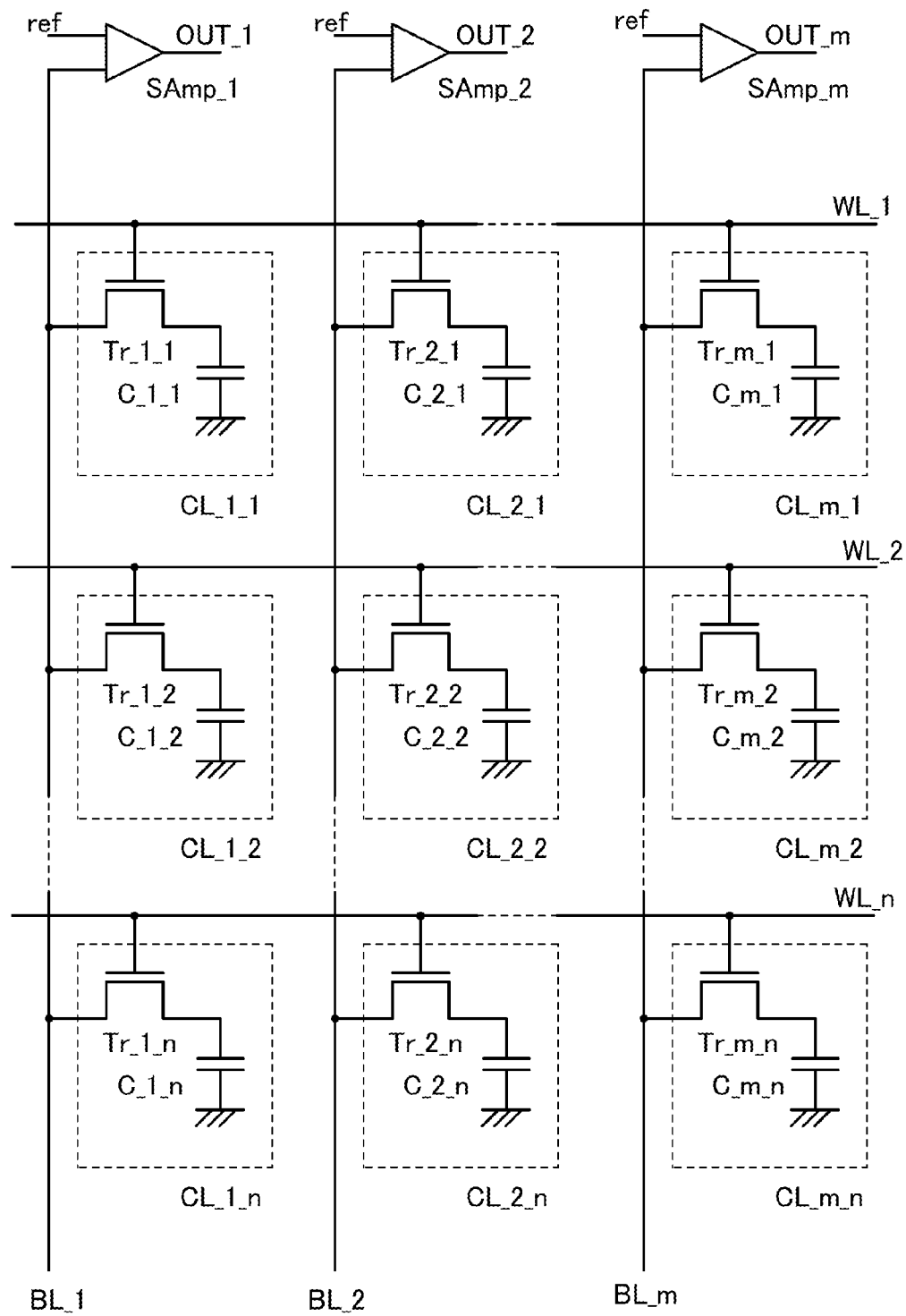
FIG. 8 is a circuit diagram illustrating an example of a semiconductor memory device according to one embodiment of the present invention.

FIG. 8 illustrates a memory cell array in which memory cells according to one embodiment of the present invention are arranged in n rows and m columns.

The memory cell array includes m×n memory cells CL, m bit lines BL, and n word lines WL. The m bit lines BL are connected to respective m sense amplifiers SAmp.

The memory cell CL includes a transistor Tr and a capacitor C. The memory cell 150, the memory cell 151, or the memory cell 152 can be applied to the memory cell CL. That is, the transistor 140, the transistor 141, or the transistor 142 can be applied to the transistor Tr, and the capacitor 130, the capacitor 131, or the capacitor 132 can be applied to the capacitor C.

Next, a method for writing data and a method for reading data in the memory cell array arranged in n rows and m columns are described.

Data is written row by row. For example, in the case where data is written in memory cells CL_1_b to CL_m_b, after a potential VH is applied to a word line WL_b, the potential of a bit line in a column in which Data 1 is to be written in the memory cells is set to VDD, and the potential of a bit line in a column in which Data 0 is to be written in the memory cells is set to GND. This operation is performed row by row, whereby data can be written in all memory cells.

Data is read out row by row. For example, in the case where data is read out from the memory cells CL_1_b to CL_m_b, bit lines BL_1 to BL_m are set to predetermined potentials (fixed potentials). Then, when the potential of the word line WL_b is set to VH, the potentials of the bit lines BL_1 to BL_m are changed in accordance with data. This operation is performed row by row, whereby data can be read out from all the memory cells.

As described above, the memory cell array in which the memory cells described in Embodiment 1 or Embodiment 2 are arranged in the n rows and the m columns can be provided.

According to this embodiment, the area of every memory cell CL can be reduced, so that the area of the memory cell array can also be reduced. Therefore, the highly integrated semiconductor memory device can be manufactured.

In addition, since the netlike conductive film 118 is provided between the memory cells CL, owing to the effect as a guard ring, electrostatic breakdown of every memory cell CL can be prevented. Accordingly, the semiconductor memory device with a high yield can be manufactured.

This embodiment can be implemented in appropriate combination with any of the other embodiments.

Embodiment 4

A central processing unit (CPU) can be formed using the semiconductor memory device described in any of Embodiments 1 to 3 for at least part of the CPU.

Figure 9A:
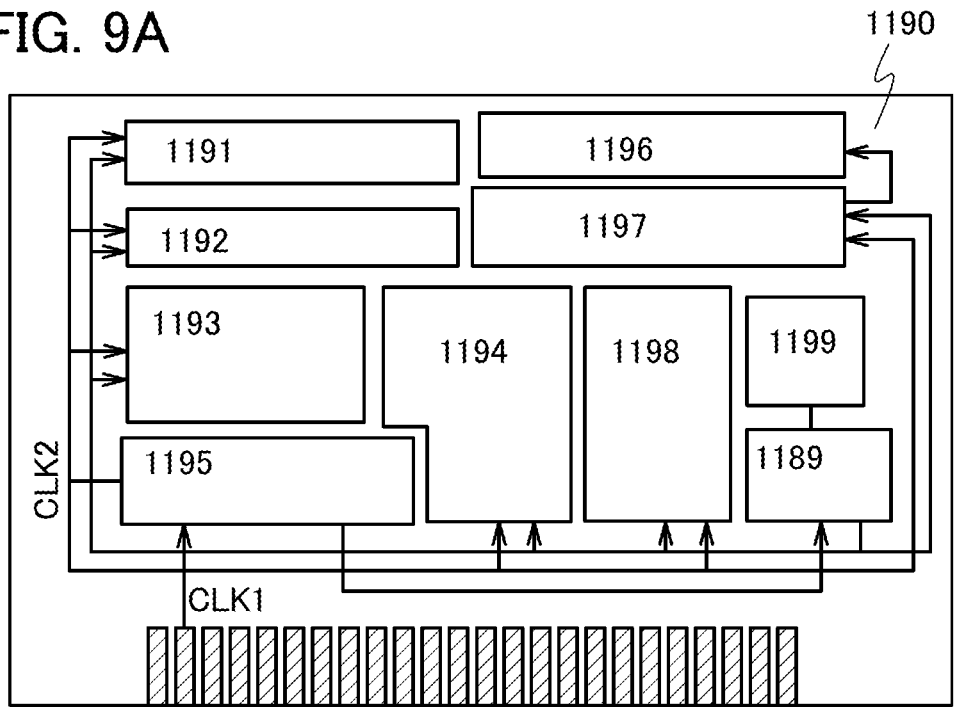
FIG. 9A is a block diagram illustrating a specific example of a CPU according to an embodiment of the present invention and FIGS. 9B and 9C are circuit diagrams each illustrating part of the CPU.

FIG. 9A is a block diagram illustrating a specific structure of a CPU. The CPU illustrated in FIG. 9A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 9A is only an example in which the structure is simplified, and a variety of structures is applied to an actual CPU depending on the application.

An instruction that is input to the CPU via the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 9A, a semiconductor memory device is provided in the register 1196. As the semiconductor memory device in the register 1196, for example, the semiconductor memory device described in Embodiment 3 can be used.

In the CPU illustrated in FIG. 9A, the register controller 1197 selects operation of retaining data in the register 1196 in accordance with an instruction from the ALU 1191. That is, the register controller 1197 determines whether data is retained by a phase-inversion element or by a capacitor in the semiconductor memory device included in the register 1196. When data retention by the phase-inversion element is selected, power supply voltage is supplied to the semiconductor memory device in the register 1196. When data retention by the capacitor is selected, the data is rewritten in the capacitor, and supply of power supply voltage to the semiconductor memory device in the register 1196 can be stopped.

Figure 9B:
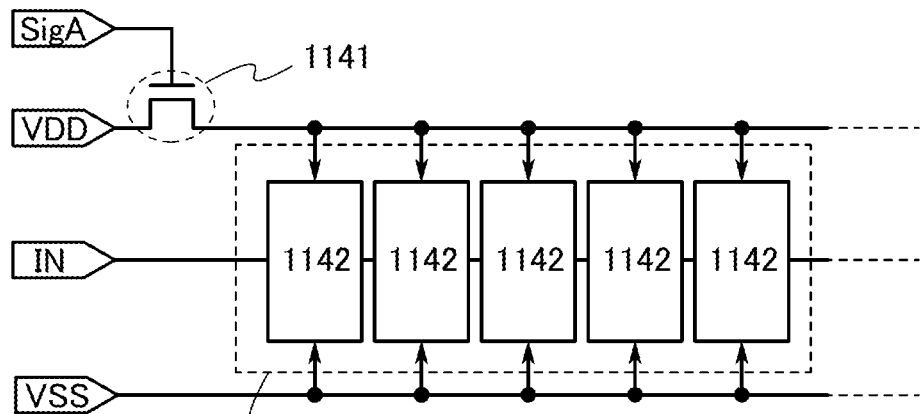
Figure 9C:
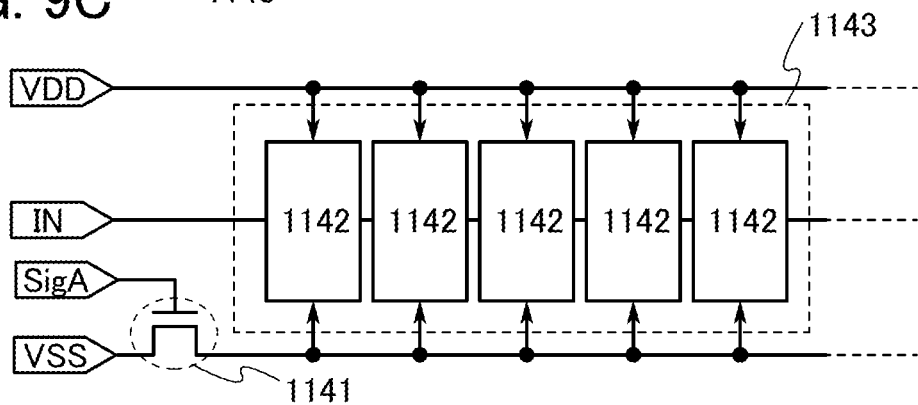

The power supply can be stopped by a switching element provided between a semiconductor memory device group and a node to which a power supply potential VDD or a power supply potential VSS is supplied, as illustrated in FIG. 9B or FIG. 9C. Circuits illustrated in FIGS. 9B and 9C are described below.

FIGS. 9B and 9C each illustrate an example of a structure of a memory circuit in which a transistor whose active layer is formed using an oxide semiconductor is used as a switching element for controlling supply of a power supply potential to a semiconductor memory device.

The memory device illustrated in FIG. 9B includes a switching element 1141 and a semiconductor memory device group 1143 including a plurality of semiconductor memory devices 1142. Specifically, as each of the semiconductor memory devices 1142, the semiconductor memory device described in Embodiment 3 can be used. Each of the semiconductor memory devices 1142 included in the semiconductor memory device group 1143 is supplied with the high-level power supply potential VDD via the switching element 1141. Further, each of the semiconductor memory devices 1142 included in the semiconductor memory device group 1143 is supplied with a potential of a signal IN and the low-level power supply potential VSS.

In FIG. 9B, a transistor whose active layer includes a semiconductor with a wide bandgap, such as an oxide semiconductor, is used as the switching element 1141, and the switching of the transistor is controlled by a signal SigA supplied to a gate thereof. Note that the transistor 140 described in Embodiment 1 may be used as the switching element 1141.

Note that FIG. 9B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

FIG. 9C illustrates an example of a memory device in which each of the semiconductor memory devices 1142 included in the semiconductor memory device group 1143 is supplied with the low-level power supply potential VSS via the switching element 1141. The supply of the low-level power supply potential VSS to each of the semiconductor memory devices 1142 included in the semiconductor memory device group 1143 can be controlled by the switching element 1141.

When a switching element is provided between a semiconductor memory device group and a node to which the power supply potential VDD or the power supply potential VSS is supplied, data can be retained even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the consumed power can be reduced.

Although the CPU is given as an example here, the semiconductor memory device can also be applied to an LSI such as a digital signal processor (DSP), a custom LSI, or a field programmable gate array (FPGA).

This embodiment can be implemented in appropriate combination with any of the other embodiments.

Embodiment 5

In this embodiment, examples of electronic devices to which any of Embodiments 1 to 4 is applied will be described.

Figure 10A:
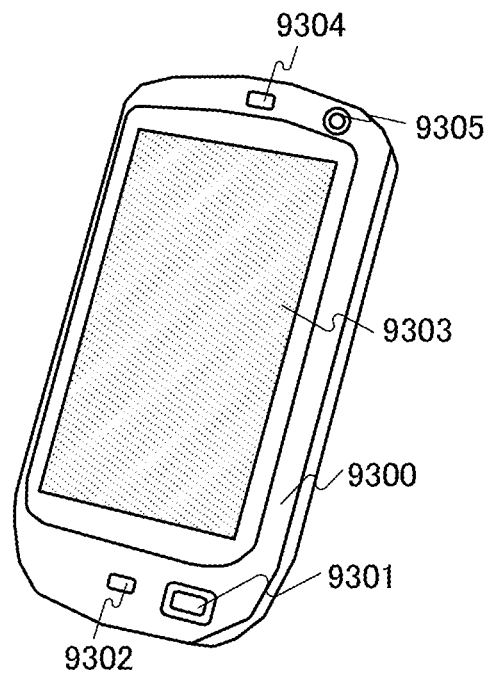
FIGS. 10A and 10B are perspective views each illustrating an example of an electronic device according to one embodiment of the present invention.

FIG. 10A illustrates a portable information terminal. The portable information terminal includes a housing 9300, a button 9301, a microphone 9302, a display portion 9303, a speaker 9304, and a camera 9305, and has a function as a mobile phone. One embodiment of the present invention can be applied to a CPU and a semiconductor memory device inside the electronic device.

Figure 10B:
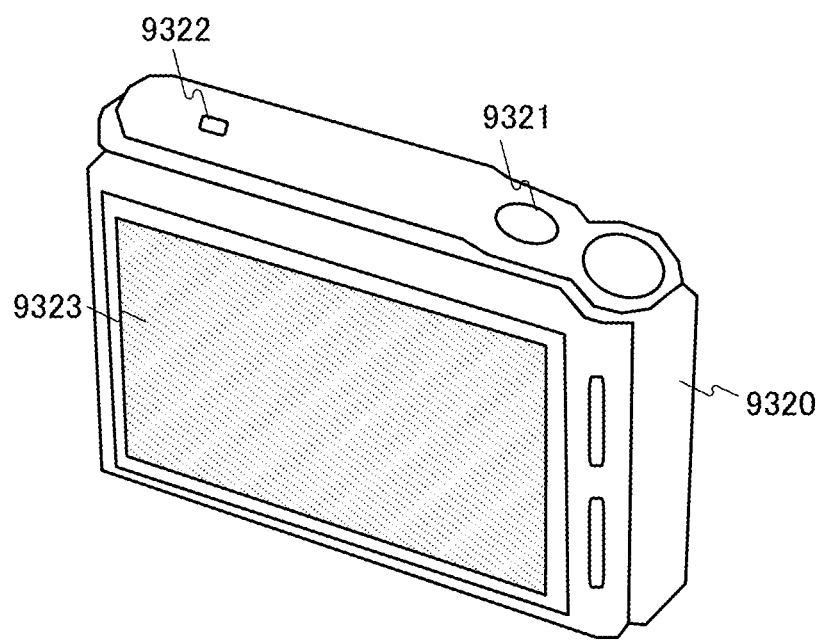

FIG. 10B illustrates a digital still camera. The digital still camera includes a housing 9320, a button 9321, a microphone 9322, and a display portion 9323. One embodiment of the present invention can be applied to a semiconductor memory device inside the electronic device.

By applying one embodiment of the present invention, the quality of an electric device can be improved. In addition, power consumption can be reduced, and reliability can be improved.

This embodiment can be implemented in appropriate combination with any of the other embodiments.

Embodiment 6

A crystal portion included in a CAAC-OS film will be described below.

A CAAC-OS film is a novel oxide semiconductor film.

An example of a crystal structure included in a crystal portion of a CAAC-OS film will be described with reference to FIGS. 11A to 11E, FIGS. 12A to 12C, and FIGS. 13A to 13C.

In FIGS. 11A to 11E, FIGS. 12A to 12C, and FIGS. 13A to 13C, the vertical direction corresponds to the c-axis direction and a plane perpendicular to the c-axis direction corresponds to the a-b plane.

In this embodiment, the expressions of an "upper half" and a "lower half" refer to an upper half above the a-b plane and a lower half below the a-b plane, respectively. Furthermore, in FIGS. 11A to 11E, O surrounded by a circle represents tetracoordinate O and O surrounded by a double circle represents tricoordinate O.

Figure 11A:
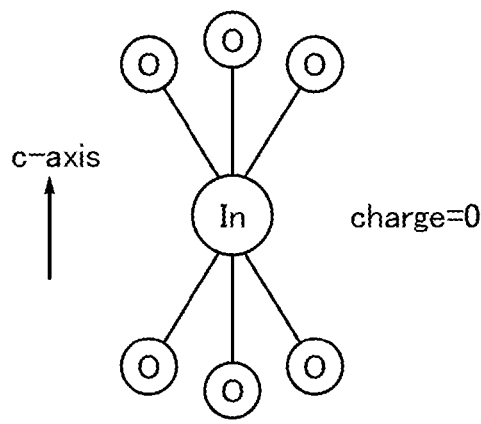
FIGS. 11A to 11E are examples of an oxide semiconductor.

FIG. 11A illustrates a structure A including one hexacoordinate In atom and six tetracoordinate oxygen (hereinafter referred to as tetracoordinate O) atoms proximate to the In atom.

Here, a structure including one metal atom and oxygen atoms proximate thereto is referred to as a small group.

The structure A is actually an octahedral structure, but is illustrated as a planar structure for simplicity.

Note that in the structure A, three tetracoordinate O atoms exist in each of an upper half and a lower half. In the small group in the structure A, electric charge is 0.

Figure 11D:
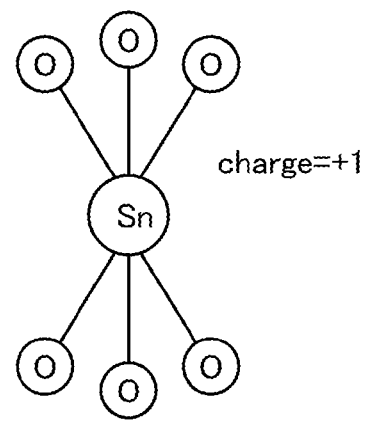
Figure 11B:
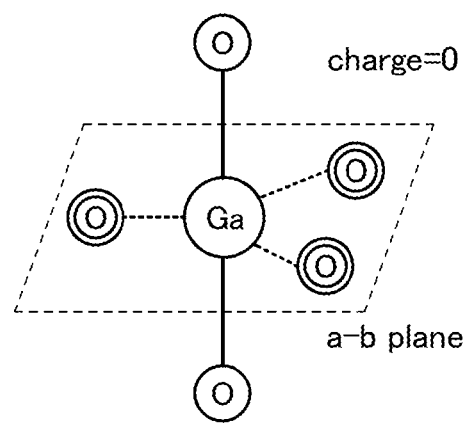

FIG. 11B illustrates a structure B including one pentacoordinate Ga atom, three tricoordinate oxygen (hereinafter referred to as tricoordinate O) atoms proximate to the Ga atom, and two tetracoordinate O atoms proximate to the Ga atom.

All the tricoordinate O atoms exist on the a-b plane. In the structure B, one tetracoordinate O atom exists in each of an upper half and a lower half.

An In atom can also have the structure B because an In atom can have five ligands. In the small group in the structure B, electric charge is 0.

Figure 11E:
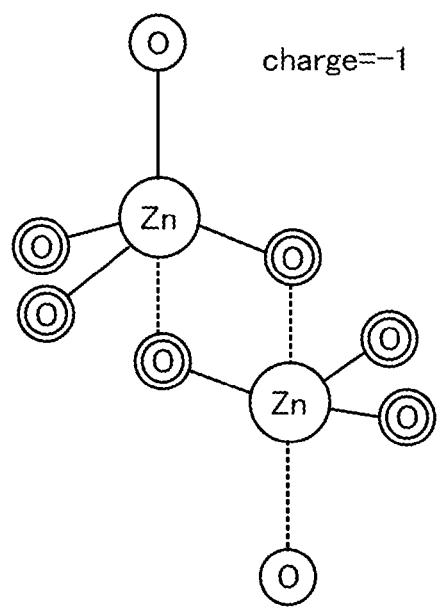
Figure 11C:
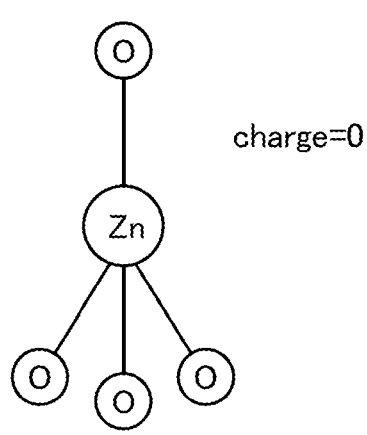

FIG. 11C illustrates a structure C including one tetracoordinate Zn atom and four tetracoordinate O atoms proximate to the Zn atom.

In the structure C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 12C. In the small group in the structure C, electric charge is 0.

FIG. 11D illustrates a structure D including one hexacoordinate Sn atom and six tetracoordinate O atoms proximate to the Sn atom.

In the structure D, three tetracoordinate O atoms exist in each of an upper half and a lower half.

In the small group in the structure D, electric charge is +1.

FIG. 11E illustrates a structure E including two Zn atoms. In the structure E, one tetracoordinate 0 atom exists in each of an upper half and a lower half. In the small group in the structure E, electric charge is −1.

In this embodiment, a plurality of small groups form a medium group, and a plurality of medium groups form a large group (also referred to as a unit cell).

Now, a rule of bonding between the small groups will be described.

The three O atoms in the upper half with respect to the hexacoordinate In atom each have three proximate In atoms in the downward direction, and the three O atoms in the lower half each have three proximate In atoms in the upward direction.

The one O atom in the upper half with respect to the pentacoordinate Ga atom has one proximate Ga atom in the downward direction, and the one O atom in the lower half has one proximate Ga atom in the upward direction.

The one O atom in the upper half with respect to the tetracoordinate Zn atom has one proximate Zn atom in the downward direction, and the three O atoms in the lower half each have three proximate Zn atoms in the upward direction In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms.

Since the coordination number of the tetracoordinate O atom is 4, the sum of the number of the metal atoms proximate to and below the O atom and the number of the metal atoms proximate to and above the O atom is 4.

Therefore, when the sum of the number of tetracoordinate O atoms above a metal atom and the number of tetracoordinate O atoms below another metal atom is 4, the two kinds of small groups including the metal atoms can be bonded.

This is because in the case, for example, where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction.

In addition to the above, a medium group can be formed in a different manner by combining a plurality of small groups so that the total electric charge of the layered structure is 0.

FIG. 12A illustrates a model of a medium group A included in a layered structure of an In—Sn—Zn—O-based material.

FIG. 12B illustrates a large group B including three medium groups.

Note that FIG. 12C illustrates an atomic arrangement in the case where the layered structure in FIG. 12B is observed from the c-axis direction.

In FIG. 12A, a tricoordinate O atom is omitted, only the number of tetracoordinate O atoms is shown.

For example, three tetracoordinate O atoms existing in each of an upper half and a lower half with respect to a Sn atom are denoted by circled 3.

Similarly, in the medium group A, one tetracoordinate O atom existing in each of an upper half and a lower half with respect to an In atom is denoted by circled 1.

In addition, the medium group A illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group A included in the layered structure of the In—Sn—Zn—O-based material, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group.

A plurality of such medium groups are bonded, so that a large group is formed.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Therefore, electric charge in a small group including a Sn atom is +1.

Therefore, electric charge of −1, which cancels +1, is needed to form a layered structure including a Sn atom.

As a structure having electric charge of −1, the small group including two Zn atoms as shown in the structure E can be given.

For example, with one small group including two Zn atoms, electric charge of one small group including a Sn atom can be cancelled, so that the total electric charge of the layered structure can be 0.

When the large group B is repeated, an In—Sn—Zn—O-based crystal ($In_2SnZn_3O_8$) can be obtained.

A layered structure of the obtained In—Sn—Zn—O-based crystal can be expressed as a composition formula, $In_2SnZn_2O_7(ZnO)_m$ (m is 0 or a natural number).

The above-described rule also applies to the following materials: a four-component metal oxide such as an In—Sn—

Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

Figure 13A:
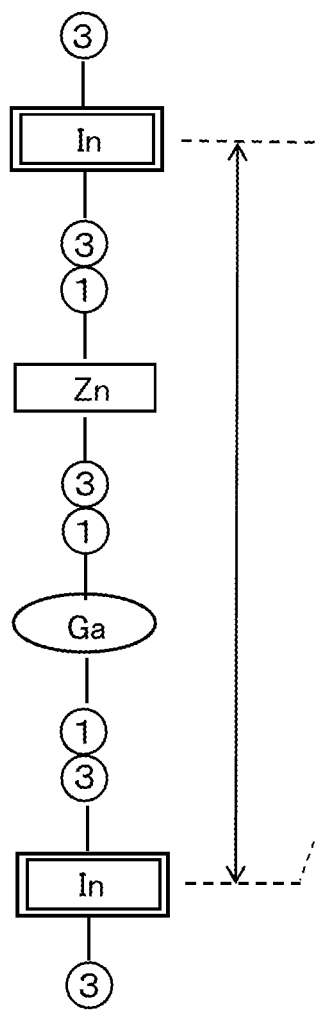
FIGS. 13A to 13C are an example of an oxide semiconductor.

For example, FIG. 13A illustrates a model of a medium group L included in a layered structure of an In—Ga—Zn—O-based material.

In the medium group L included in the layered structure of the In—Ga—Zn—O-based material, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom.

A plurality of such medium groups are bonded, so that a large group is formed.

Figure 13B:
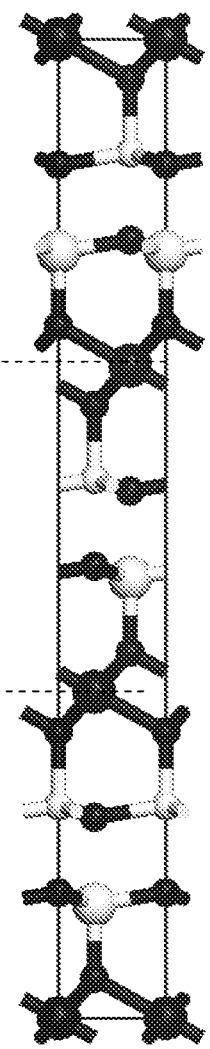

FIG. 13B illustrates a large group M including three medium groups.

Figure 13C:
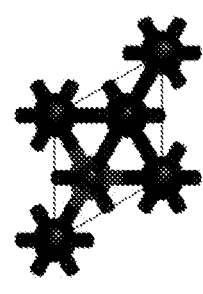

Note that FIG. 13C illustrates an atomic arrangement in the case where the layered structure in FIG. 13B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0.

As a result, the total electric charge of a medium group having a combination of such small groups is always 0.

In order to form the layered structure of the In—Ga—Zn—O-based material, a large group can be composed of not only the medium group L but also a medium group in which the arrangement of the In atom, the Ga atom, and the Zn atom is different from that of the medium group L.

Embodiment 7

The actually measured field-effect mobility of an insulated gate transistor can be lower than its original field-effect mobility because of a variety of reasons; this phenomenon occurs not only in the case of using an oxide semiconductor.

One of the reasons that reduce the field-effect mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured mobility of a semiconductor are $\mu_0$ and $\mu$, respectively, and a potential barrier (such as a grain boundary) exists in the semiconductor, the mobility $\mu$ can be expressed as Formula A of FIG. 14A.

E represents the height of the potential barrier, k represents the Boltzmann constant, and T represents the absolute temperature.

When the potential barrier is assumed to be attributed to a defect, Formula B of FIG. 14B can be obtained according to the Levinson model.

e represents the elementary charge, N represents the average defect density per unit area in a channel, $\in$ represents the permittivity of the semiconductor, n represents the number of carriers per unit area in the channel, $C_{ox}$ represents the capacitance per unit area, $V_g$ represents the gate voltage, and t represents the thickness of the channel.

In the case where the thickness of the semiconductor layer is less than or equal to 30 nm, the thickness of the channel may be regarded as being the same as the thickness of the semiconductor layer.

The drain current $I_d$ in a linear region can be expressed as Formula C of FIG. 14C.

Here, L represents the channel length and W represents the channel width, and L and W are each 10 μm in this case.

In addition, $V_d$ represents the drain voltage.

When dividing both sides of Formula C by $V_g$ and then taking logarithms of both sides, Formula D of FIG. 14D can be obtained.

The right side of Formula C is a function of $V_g$.

The above formula shows that the defect density N can be obtained from the slope of a line with $\ln(I_d/V_g)$ as the ordinate and $1/V_g$ as the abscissa.

That is, the defect density can be evaluated from the $I_d$-$V_g$ characteristics of the transistor.

The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm²/Vs.

The measured field-effect mobility of an In—Sn—Zn oxide including a defect is approximately 35 cm²/Vs.

However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by Formula E of FIG. 14E.

D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches)

When D is increased (i.e., when the gate voltage is increased), the second term of Formula E is increased and accordingly the mobility $\mu_1$ is decreased.

Figure 15:
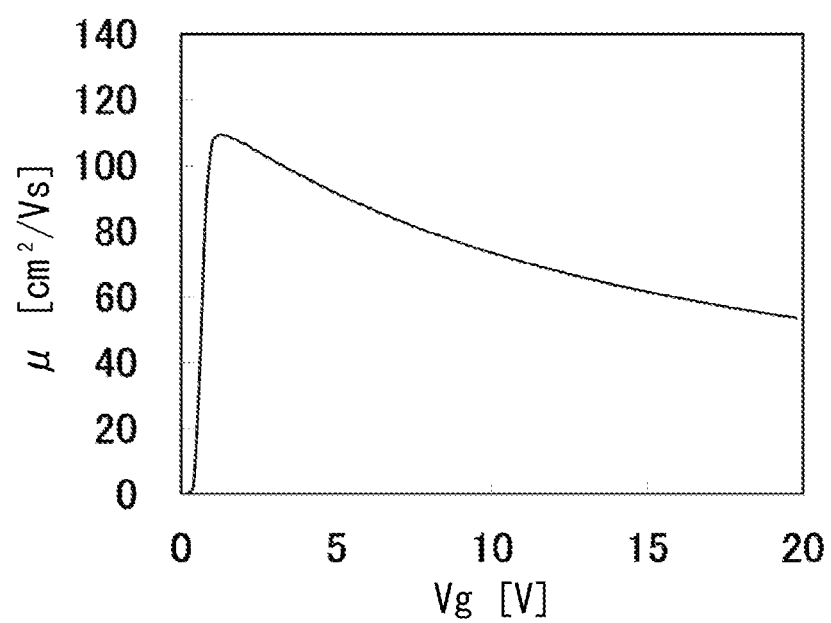
FIG. 15 shows a relation between gate voltage and field-effect mobility.

Calculation results of the mobility $\mu_2$ of a transistor whose channel includes an ideal oxide semiconductor without a defect inside the semiconductor are shown in FIG. 15.

For the calculation, device simulation software Sentaurus Device manufactured by Synopsys, Inc. was used.

For the calculation, the band gap, the electron affinity, the dielectric constant, and the thickness of the oxide semiconductor were assumed to be 2.8 eV, 4.7 eV, 15, and 15 nm, respectively.

These values were obtained by measurement of a thin film that was formed by a sputtering method.

Further, the work functions of a gate, a source, and a drain were assumed to be 5.5 eV, 4.6 eV, and 4.6 eV, respectively.

The thickness of a gate insulating film was assumed to be 100 nm, and the dielectric constant thereof was assumed to be 4.1. The channel length and the channel width were each assumed to be 10 μm, and the drain voltage $V_d$ was assumed to be 0.1 V.

As shown in the calculation results, the mobility has a peak of greater than or equal to 100 cm$^2$/Vs at a gate voltage that is a little over 1 V and is decreased as the gate voltage becomes higher because the influence of interface scattering is increased.

Note that in order to reduce interface scattering, it is preferable that a surface of the semiconductor layer be flat at the atomic level (atomic layer flatness).

Characteristics of minute transistors which are manufactured using an oxide semiconductor having such mobility were calculated.

The transistor used for calculation includes a channel formation region provided between a pair of n-type semiconductor regions in the oxide semiconductor layer.

The calculation was performed under the condition that the resistivity of the pair of n-type semiconductor regions is 2×10$^{-3}$ Ωcm.

The calculation was performed under the condition that a channel length was 33 nm and a channel width was 40 nm.

Further, a sidewall is provided on the side wall of the gate electrode.

The calculation was performed under the condition that part of the semiconductor region which overlaps with the sidewall is an offset region.

For the calculation, Sentaurus Device which is software manufactured by Synopsys, Inc. was used.

Figure 16A:
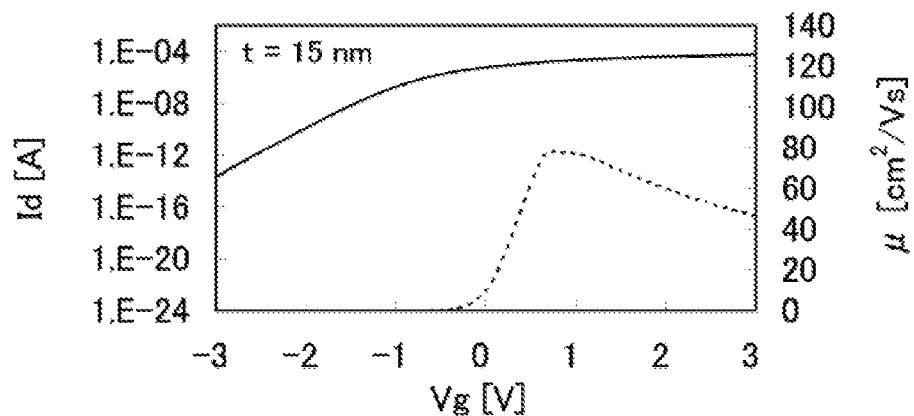
FIGS. 16A to 16C each show a relation between gate voltage and drain current.
Figure 16B:
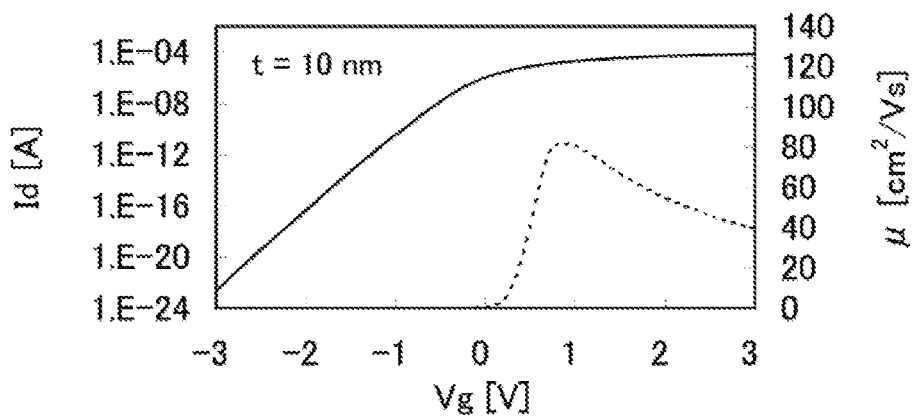
Figure 16C:
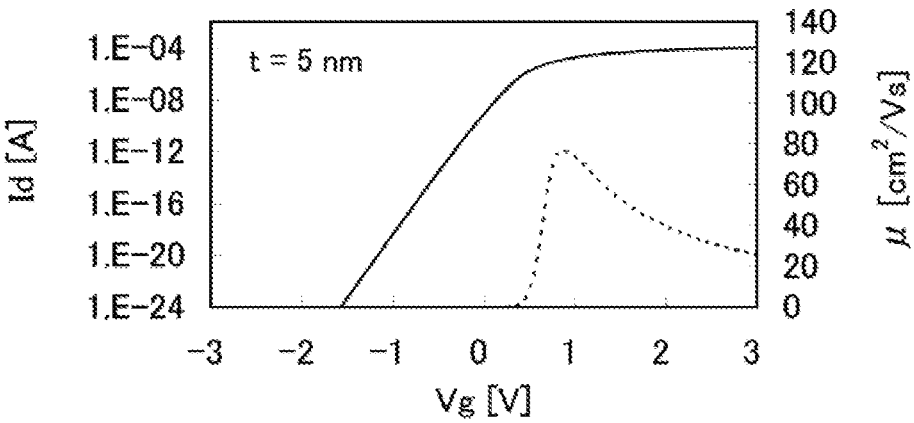

FIGS. 16A to 16C are calculation results of the gate voltage ($V_g$: a potential difference between the gate and the source) dependence of the drain current ($I_d$, solid line) and the mobility (m, dotted line) of the transistor.

The drain current $I_d$ is obtained by calculation under the condition that the drain voltage (a potential difference between the drain and the source) is +1 V and the mobility μ is obtained by calculation under the condition that the drain voltage is +0.1 V.

FIG. 16A shows the calculation result under the condition that the thickness of the gate insulating film is 15 nm.

FIG. 16B shows the calculation result under the condition that the thickness of the gate insulating film is 10 nm.

FIG. 16C shows the calculation result under the condition that the thickness of the gate insulating film is 5 nm.

As the gate insulating film becomes thinner, the drain current $I_d$ (off-state current) particularly in an off state is significantly decreased.

In contrast, there is no noticeable change in the peak value of the mobility μ and the drain current $I_d$ (on-state current) in an on state.

Figure 17A:
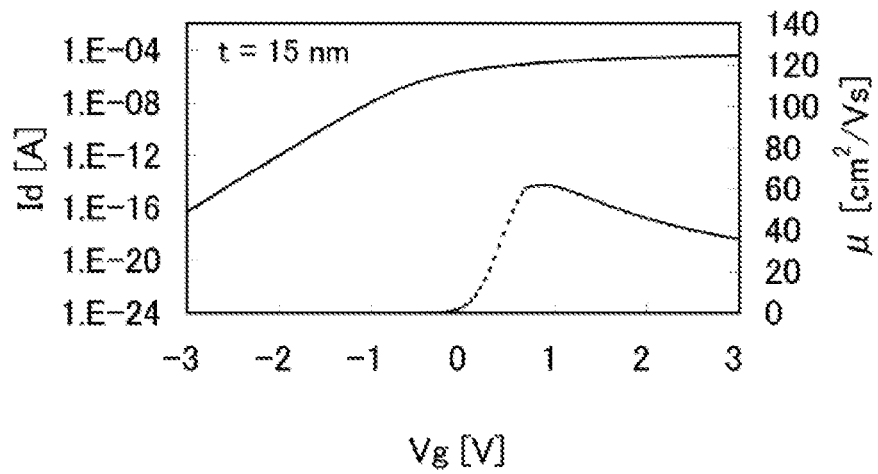
FIGS. 17A to 17C each show a relation between gate voltage and drain current.
Figure 17B:
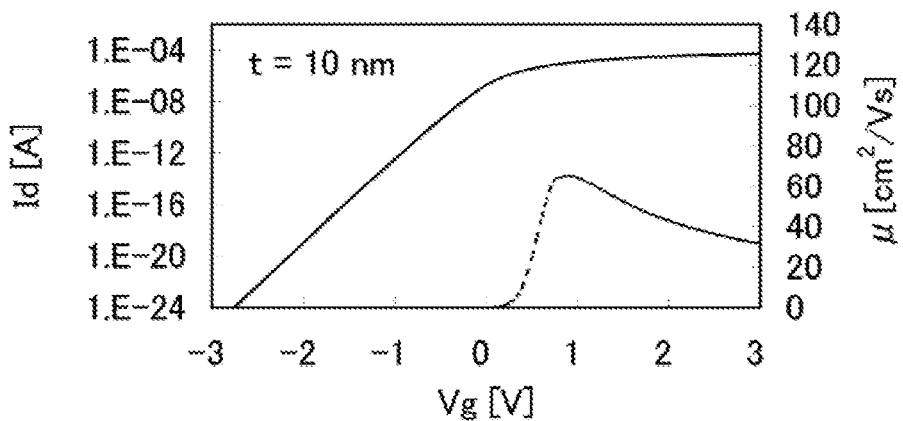
Figure 17C:
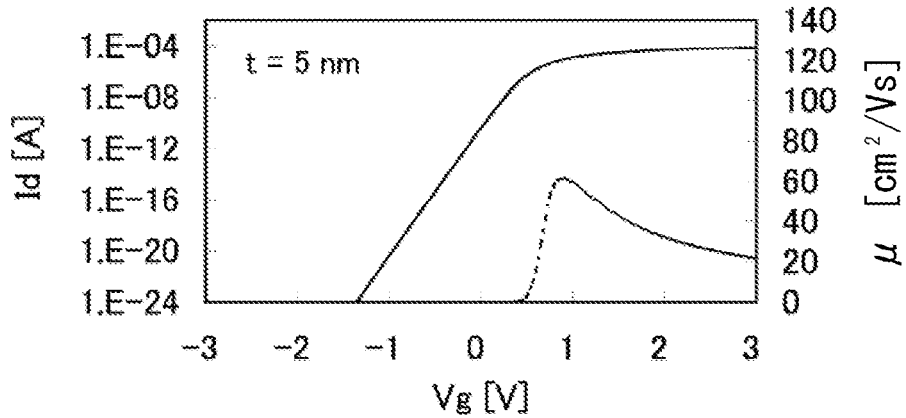

FIGS. 17A to 17C show the gate voltage $V_g$ dependence of the drain current $I_d$ (solid line) and the mobility μ (dotted line) under the condition that the offset length (sidewall length) $L_{off}$ is 5 nm.

The drain current $I_d$ is obtained by calculation under the condition that the drain voltage is +1 V and the mobility μ is obtained by calculation under the condition that the drain voltage is +0.1 V.

FIG. 17A shows the calculation result under the condition that the thickness of the gate insulating film is 15 nm.

FIG. 17B shows the calculation result under the condition that the thickness of the gate insulating film is 10 nm.

FIG. 17C shows the calculation result under the condition that the thickness of the gate insulating film is 5 nm.

Figure 18A:
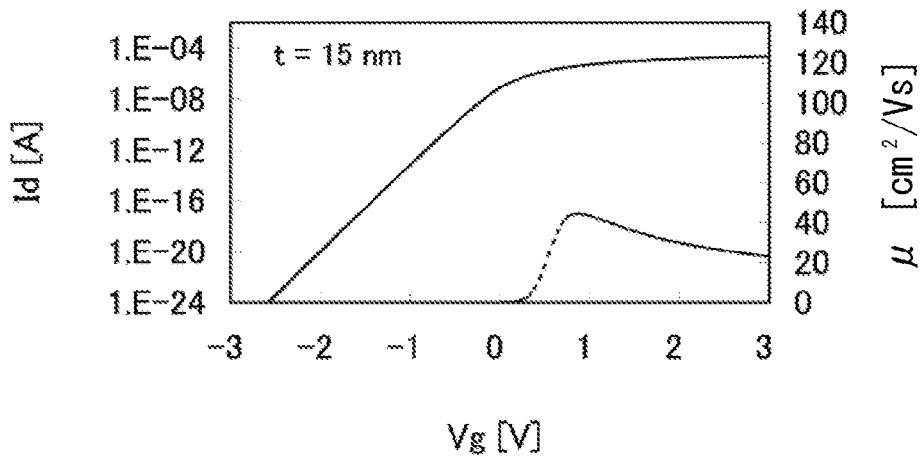
FIGS. 18A to 18C each show a relation between gate voltage and drain current.
Figure 18B:
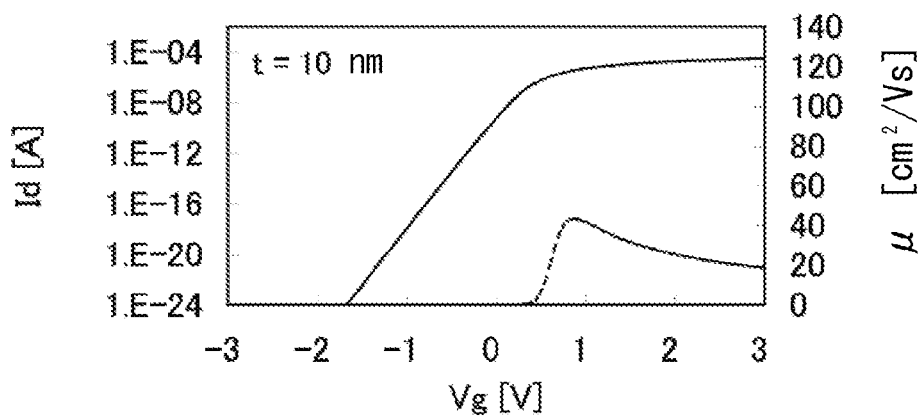
Figure 18C:
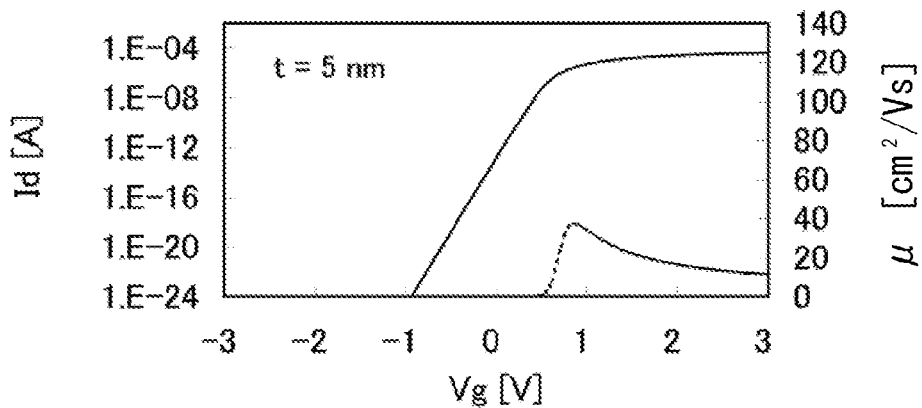

FIGS. 18A to 18C show the gate voltage dependence of the drain current $I_d$ (solid line) and the mobility μ (dotted line) under the condition that the offset length (sidewall length) $L_{off}$ is 15 nm.

The drain current $I_d$ is obtained by calculation under the condition that the drain voltage is +1 V and the mobility μ is obtained by calculation under the condition that the drain voltage is +0.1 V.

FIG. 18A shows the calculation result under the condition that the thickness of the gate insulating film is 15 nm.

FIG. 18B shows the calculation result under the condition that the thickness of the gate insulating film is 10 nm.

FIG. 18C shows the calculation result under the condition that the thickness of the gate insulating film is 5 nm.

In either of the structures, as the gate insulating film is thinner, the off-state current is significantly decreased, whereas no noticeable change arises in the peak value of the field-effect mobility μ and the on-state current.

Note that the peak of the mobility μ is approximately 80 cm$^2$/Vs in FIGS. 16A to 16C, approximately 60 cm$^2$/Vs in FIGS. 17A to 17C, and approximately 40 cm$^2$/Vs in FIGS. 18A to 18C; thus, the peak of the mobility μ is decreased as the offset length $L_{off}$ is increased.

Further, the same applies to the off-state current.

The on-state current is also decreased as the offset length $L_{off}$ is increased; however, the decrease in the on-state current is much more gradual than the decrease in the off-state current.

Further, the graphs show that in either of the structures, the drain current exceeds 10 μA, which is required in a memory element and the like, at a gate voltage of around 1 V. The contents of this embodiment or part thereof can be implemented in combination with any of the other embodiments and example.

Example 1

A transistor including an oxide semiconductor containing In, Sn, and Zn can have favorable characteristics by deposition of the oxide semiconductor while heating a substrate or by heat treatment after deposition of an oxide semiconductor film.

Note that each of In, Sn, and Zn is preferably contained in a composition at 5 atomic % or more.

By intentionally heating the substrate after the deposition of the oxide semiconductor film containing In, Sn, and Zn, the field-effect mobility of the transistor can be improved.

Further, the threshold voltage of an n-channel transistor can be shifted in the positive direction.

The threshold voltage of the n-channel transistor is shifted in the positive direction, so that the absolute value of a voltage for maintaining the off state of the n-channel transistor can be reduced; thus, low power consumption can be achieved.

In addition, when the threshold voltage of the n-channel transistor is shifted in the positive direction to 0 V or more, a normally-off transistor can be obtained.

The characteristics of a transistor including an oxide semiconductor containing In, Sn, and Zn are described below.
(Common Conditions of Sample A to Sample C)

An oxide semiconductor layer was formed over a substrate to have a thickness of 15 nm under the following conditions: a target having a composition ratio of In:Sn:Zn=1:1:1 is used;

the gas flow rate is Ar/O$_2$=6/9 sccm; the deposition pressure is 0.4 Pa; and the deposition power is 100 W.

Next, the oxide semiconductor layer was etched in an island shape.

Then, a tungsten layer was deposited over the oxide semiconductor layer to have a thickness of 50 nm. The tungsten layer was etched, so that a source electrode and a drain electrode were formed.

After that, a silicon oxynitride (SiON) film was formed as a gate insulating layer to have a thickness of 100 nm by a plasma CVD method using a silane (SiH$_4$) gas and dinitrogen monoxide (N$_2$O) gas.

Then, a gate electrode was formed in the following manner: a tantalum nitride layer was formed to have a thickness of 15 nm; a tungsten layer was formed to have a thickness of 135 nm; and these were etched.

After that, a silicon oxynitride (SiON) film with a thickness of 300 nm was formed by a plasma CVD method and a polyimide film with a thickness of 1.5 μm was formed, so that an interlayer insulating film was formed.

Next, a pad for measurement was formed in the following manner: a contact hole was formed in the interlayer insulating film; a first titanium film was formed to have a thickness of 50 nm; an aluminum film was formed to have a thickness of 100 nm; a second titanium film was formed to have a thickness of 50 nm; and these films were etched.

In this manner, a semiconductor device including a transistor was formed.

(Sample A)

In Sample A, heating was not intentionally performed to the substrate during the deposition of the oxide semiconductor layer.

Further in Sample A, heat treatment was not performed in a period after the oxide semiconductor layer was deposited before the oxide semiconductor layer was etched.

(Sample B)

In Sample B, the oxide semiconductor layer was deposited while the substrate was heated to 200° C.

Further in Sample B, heat treatment was not performed in a period after the oxide semiconductor layer was deposited before the oxide semiconductor layer was etched.

The oxide semiconductor layer was deposited while the substrate was heated in order to remove hydrogen serving as a donor in the oxide semiconductor layer.

(Sample C)

In Sample C, the oxide semiconductor layer was deposited while the substrate was heated to 200° C.

Further in Sample C, heat treatment in a nitrogen atmosphere was performed at 650° C. for one hour and then heat treatment in an oxygen atmosphere was performed at 650° C. for one hour after the oxide semiconductor layer was deposited before the oxide semiconductor layer was etched.

The heart treatment was performed in a nitrogen atmosphere at 650° C. for one hour in order to remove hydrogen serving as a donor in the oxide semiconductor layer.

With the heat treatment for removing hydrogen serving as a donor in the oxide semiconductor layer, oxygen is also removed to form oxygen vacancy serving as a carrier in the oxide semiconductor layer.

Thus, the heat treatment in an oxygen atmosphere at 650° C. for one hour was performed for reduction in oxygen vacancy.

(Characteristics of Transistors in Sample A to Sample C)

Figure 19A:
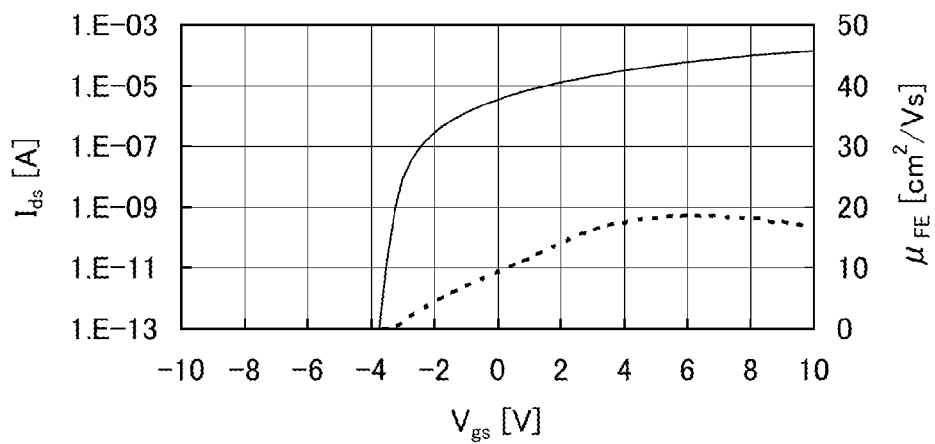
FIGS. 19A to 19C each show the characteristics of a transistor.

FIG. 19A shows initial characteristics of a transistor in Sample A.

Figure 19B:
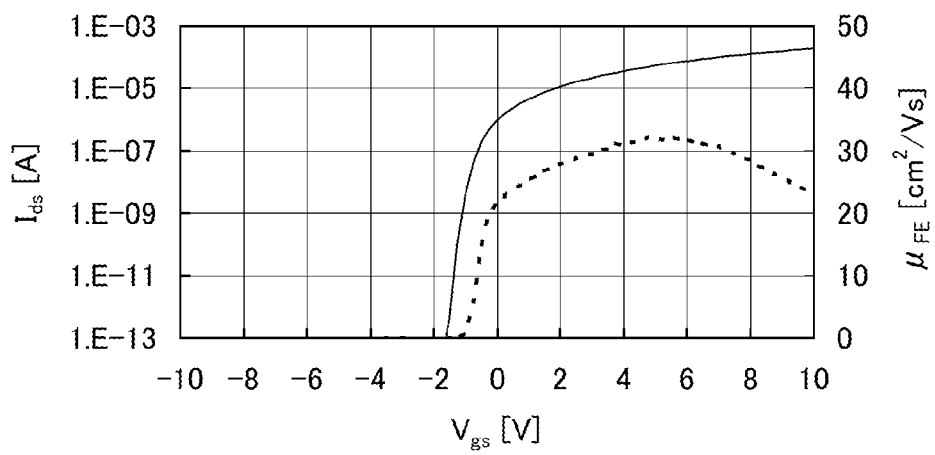

FIG. 19B shows initial characteristics of a transistor in Sample B.

Figure 19C:
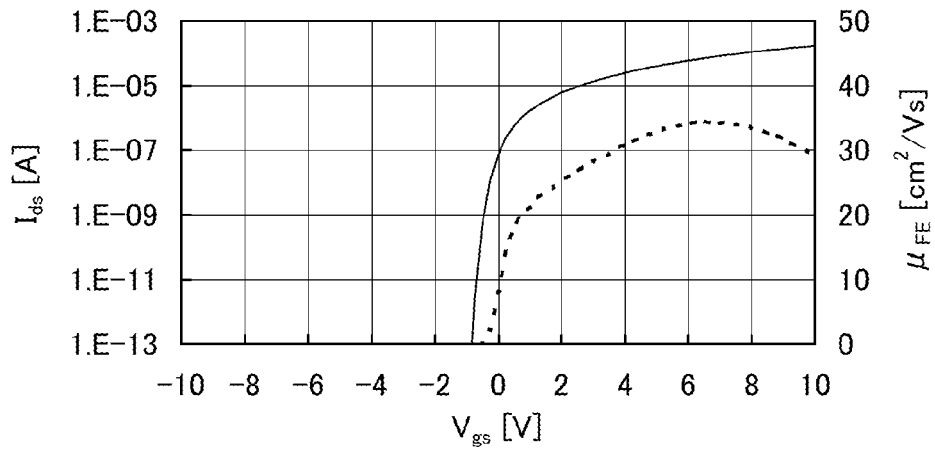

FIG. 19C shows initial characteristics of a transistor in Sample C.

The field-effect mobility of the transistor in Sample A was 18.8 cm$^2$/Vsec.

The field-effect mobility of the transistor in Sample B was 32.2 cm$^2$/Vsec.

The field-effect mobility of the transistor in Sample C was 34.5 cm$^2$/Vsec.

According to observations of cross sections of oxide semiconductor layers, which were formed by deposition methods similar to respective those of Sample A to Sample C, with a transmission electron microscope (TEM), crystallinity was observed in samples formed by the deposition methods similar to respective those of Sample B and Sample C whose substrates have been heated during deposition.

Surprisingly, the sample whose substrate had been heated during deposition had a non-crystalline portion and a crystalline portion was aligned in the c-axis direction.

In a normal polycrystal, the crystalline portion is not aligned. This means that the sample whose substrate has been heated during deposition has a novel crystal structure.

Comparison of FIG. 19A to FIG. 19C leads to understanding that heat treatment performed to the substrate during or after deposition can remove an hydrogen element serving as a donor, so that the threshold voltage of the n-channel transistor can be shifted in the positive direction.

That is, the threshold voltage of Sample B in which heating was performed to the substrate during deposition is shifted in the positive direction more than the threshold voltage of Sample A in which heating was not performed to the substrate during deposition.

In addition, comparing Sample B and Sample C, substrates of which were heated during deposition, it is found that the threshold voltage of Sample C in which heat treatment was performed after deposition is shifted in the positive direction more than the threshold voltage of Sample B in which heat treatment was not performed after deposition.

Furthermore, the higher the temperature of heat treatment is, the more the light element such as a hydrogen element tends to be removed; thus, hydrogen is more likely to be removed as the temperature of heat treatment is higher.

It was therefore found that the threshold voltage can be shifted more in the positive direction by further increasing of the temperature of heat treatment.

(Results of the Gate BT Stress Test of Sample B and Sample C)

The gate BT stress test was performed on Sample B (without heat treatment after deposition) and Sample C (with heat treatment after deposition).

First, V$_{gs}$-I$_{ds}$ characteristics of the transistors were measured at a substrate temperature of 25° C. and V$_{ds}$ of 10 V to measure characteristics of the transistors before heat treatment and high positive voltage application.

Then, the substrate temperature was set to 150° C. and V$_{ds}$ was set to 0.1 V.

After that, 20 V of V$_{gs}$ was applied to a gate insulating film 608 and the condition was kept for one hour.

Next, V$_{gs}$ was set to 0 V.

Then, V$_{gs}$-I$_{ds}$ characteristics of the transistors were measured at a substrate temperature of 25° C. and V$_{ds}$ of 10 V to measure characteristics of the transistors after heat treatment and high positive voltage application.

Comparing characteristics of transistors before and after heat treatment and high positive voltage application in the above manner is called a positive BT test.

In a similar manner, V$_{gs}$-I$_{ds}$ characteristics of the transistors were measured at a substrate temperature of 25° C. and $V_{ds}$ of 10 V to measure characteristics of the transistors before heat treatment and high negative voltage application.

Then, the substrate temperature was set to 150° C. and $V_{ds}$ was set to 0.1 V.

After that, −20 V of $V_{gs}$ was applied to the gate insulating film 608 and the condition was kept for one hour.

Next, $V_{gs}$ was set to 0 V.

Then, $V_{gs}$-$I_{ds}$ characteristics of the transistors were measured at a substrate temperature of 25° C. and $V_{ds}$ of 10 V to measure characteristics of the transistors after heat treatment and high negative voltage application.

Comparing characteristics of transistors before and after heat treatment and high negative voltage application in the above manner is called a negative BT test.

Figure 20A:
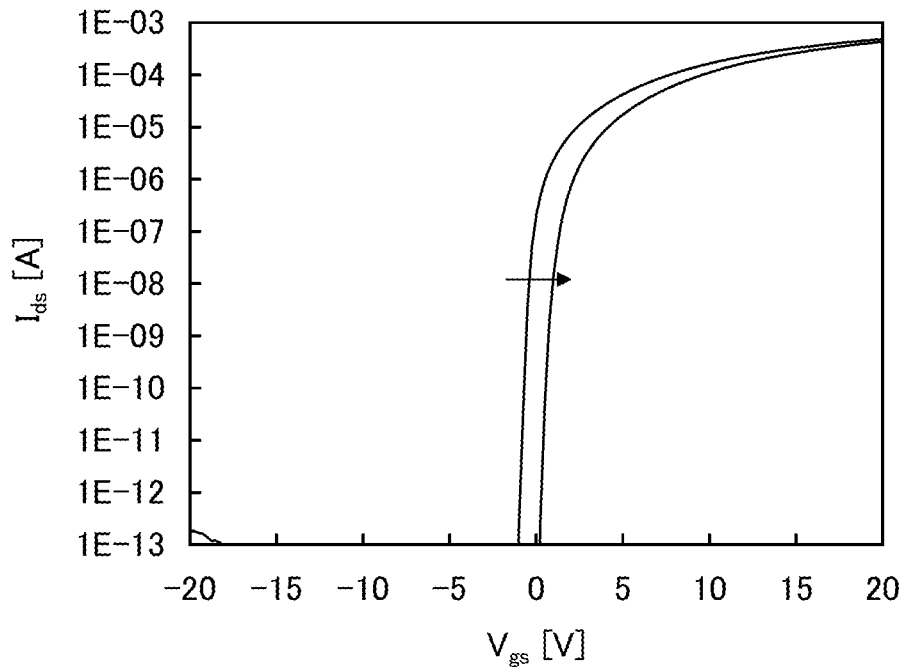
FIGS. 20A and 20B each show the characteristics of a transistor.
Figure 20B:
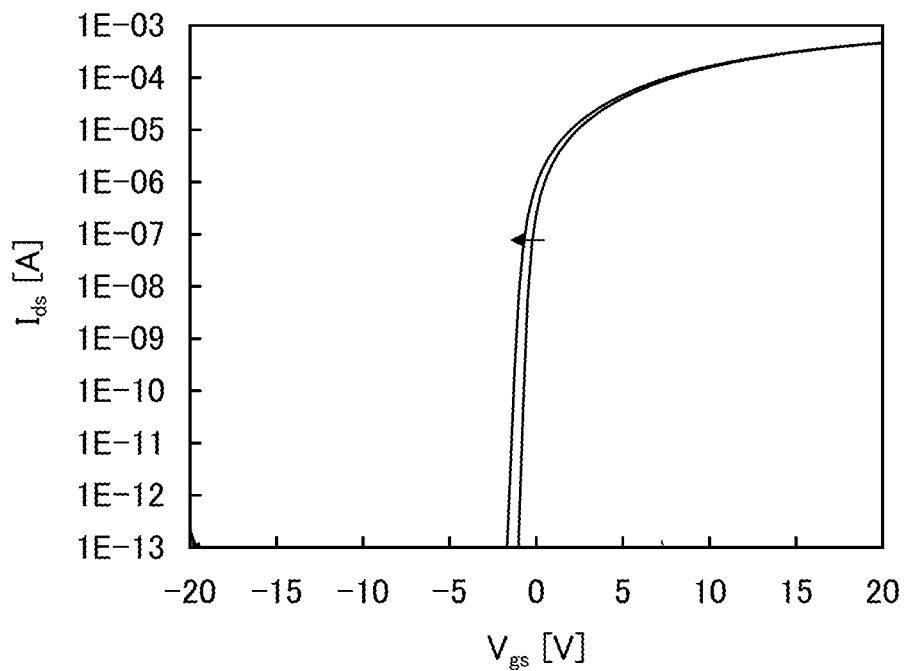

FIG. 20A shows a result of the positive BT test of Sample B and FIG. 20B shows a result of the negative BT test of Sample B.

Figure 21A:
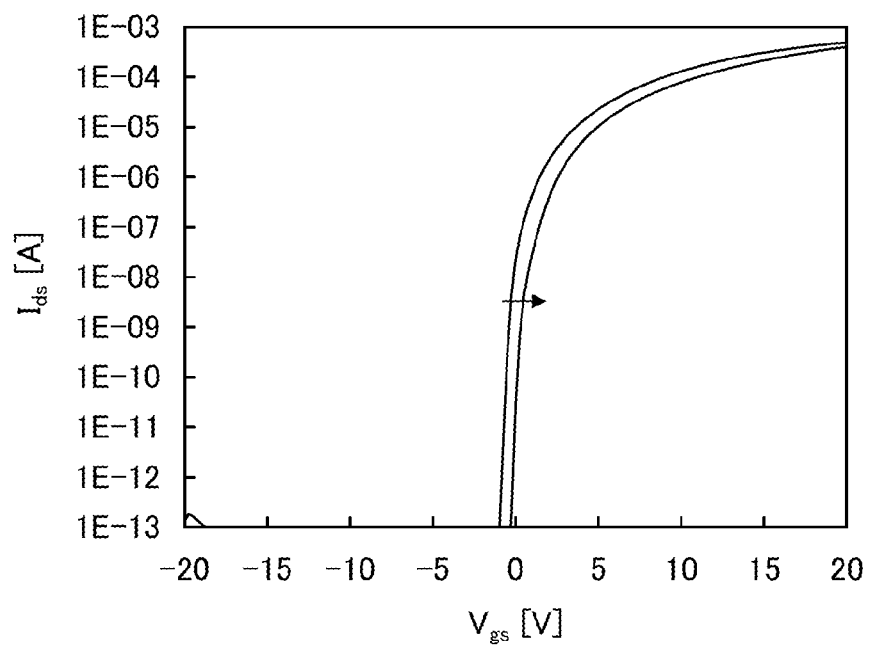
FIGS. 21A and 21B each show the characteristics of a transistor.
Figure 21B:
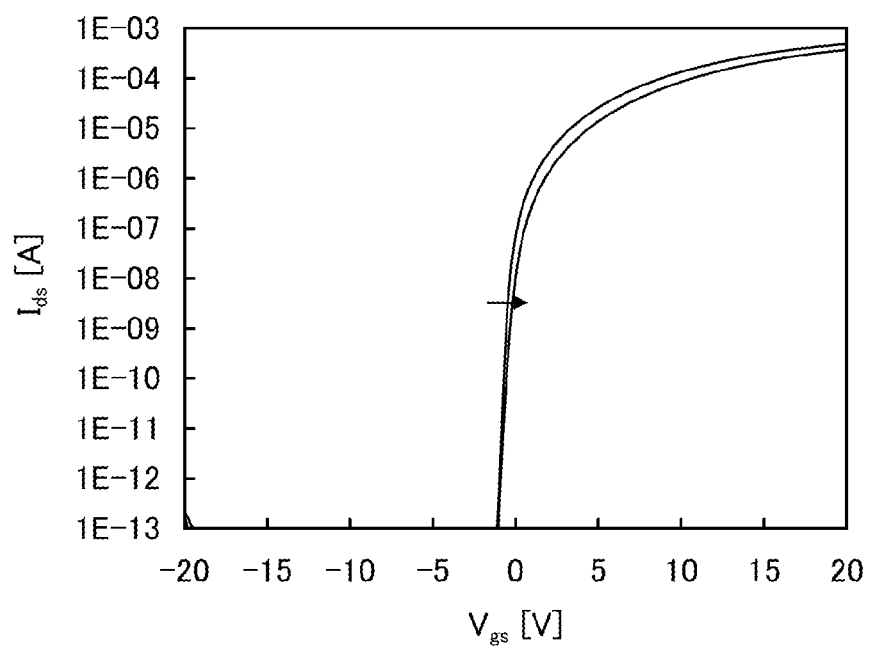

FIG. 21A shows a result of the positive BT test of Sample C and FIG. 21B shows a result of the negative BT test of Sample C.

Although the positive BT test and the negative BT test are tests used to determine the deterioration level of a transistor, with reference to FIG. 20A and FIG. 21A, it is found that the threshold voltage can be shifted in the positive direction by performing at least the positive BT test.

In FIG. 20A shows that a transistor becomes a normally-off transistor by being subjected to the positive BT test.

Therefore, it is revealed that the shift of the threshold voltage in the positive direction can be increased and a normally-off transistor can be formed by performing the positive BT test in addition to the heat treatment at the time of manufacturing the transistor.

Figure 22:
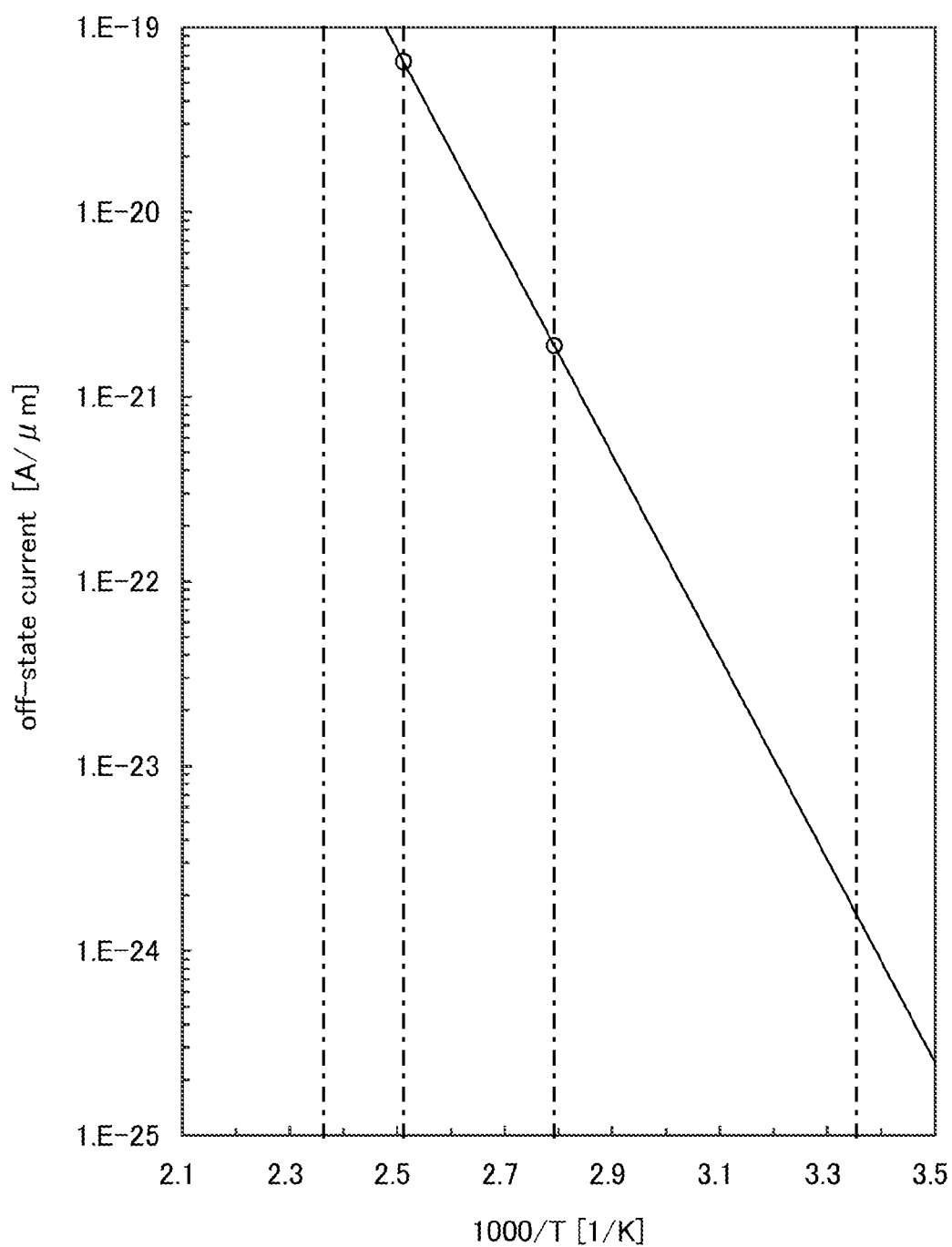
FIG. 22 shows temperature dependence of off-state current of a transistor.

FIG. 22 shows a relation between the off-state current of a transistor in Sample A and the inverse of substrate temperature (absolute temperature) at measurement.

Here, the abscissa represents a value (1000/T) obtained by multiplying an inverse of substrate temperature at measurement by 1000.

Note that FIG. 22 illustrates the amount of current in the case where the channel width is 1 μm.

The off-state current was lower than or equal to $1\times10^{-19}$ A when the substrate temperature was 125° C. (1000/T is about 2.51).

Further, the off-state current was lower than or equal to $1\times10^{-20}$ A when the substrate temperature was 85° C. (1000/T is about 2.79).

That is, it is found that the off-state current is extremely low compared to a transistor including a silicon semiconductor.

Note that as the temperature is lower, the off-state current is decreased; thus, it is clear that the off-state current at room temperature is further lower.

This application is based on Japanese Patent Application serial No. 2011-091534 filed with Japan Patent Office on Apr. 15, 2011, and Japanese Patent Application serial No. 2011-108898 filed with Japan Patent Office on May 14, 2011, the entire contents of which are hereby incorporated by reference.

What is claimed is:

1. A semiconductor memory device comprising:
   a transistor comprising:
      an electrode; and
      an oxide semiconductor film over a top surface of the electrode, wherein the oxide semiconductor film overlaps with and is electrically connected to the electrode;
   a dielectric film over the electrode and the oxide semiconductor film, wherein the dielectric film is in contact with a side surface of the electrode;
   a conductive film over the dielectric film;
   a capacitor comprising:
      the electrode;
      the conductive film; and
      the dielectric film between the side surface of the electrode and a side surface of the conductive film.

2. A semiconductor memory device comprising:
   a transistor comprising:
      a source electrode and a drain electrode;
      an oxide semiconductor film in contact with at least a top surface of the source electrode and a top surface of the drain electrode;
      a gate insulating film in contact with at least a top surface of the oxide semiconductor film; and
      a gate electrode overlapping with the oxide semiconductor film with the gate insulating film provided therebetween,
   an insulating film covering the source electrode, the drain electrode, the gate insulating film, and the gate electrode;
   a conductive film over the insulating film, wherein the conductive film has a net shape when seen from the above; and
   a capacitor comprising:
      the drain electrode;
      the conductive film; and
      the insulating film between a side surface of the drain electrode and a side surface of the conductive film,
   wherein the transistor provided in a mesh formed by the conductive film.

3. The semiconductor memory device according to claim 1, wherein a thickness of the electrode is greater than or equal to 0.5 times and less than or equal to 10 times as large as a minimum feature size F.

4. The semiconductor memory device according to claim 2, wherein a thickness of the drain electrode is greater than or equal to 0.5 times and less than or equal to 10 times as large as a minimum feature size F.

5. The semiconductor memory device according to claim 2, wherein the gate electrode is connected to a word line, wherein the source electrode is connected to a bit line, and wherein the conductive film is grounded.

6. The semiconductor memory device according to claim 2, further comprising a second insulating film filling a space between the source electrode and the drain electrode.

7. The semiconductor memory device according to claim 2, wherein the gate insulating film or the insulating film releases oxygen by heat treatment.

8. The semiconductor memory device according to claim 7, wherein the insulating film has a smaller oxygen diffusion coefficient than the gate insulating film at temperatures higher than or equal to 250° C. and lower than or equal to 450° C.

9. The semiconductor memory device according to claim 7, wherein the insulating film is an aluminum oxide film, and wherein the gate insulating film or the insulating film is a silicon oxide film or a silicon oxynitride film.

10. The semiconductor memory device according to claim 1, wherein the oxide semiconductor film comprises an In—Ga—Zn-based oxide.

11. The semiconductor memory device according to claim 1, wherein the oxide semiconductor film comprises a crystal part in which c-axis is aligned in a direction parallel to a normal vector of a surface of the oxide semiconductor film.

12. The semiconductor memory device according to claim 2, wherein the oxide semiconductor film comprises an In—Ga—Zn-based oxide.

13. The semiconductor memory device according to claim 2, wherein the oxide semiconductor film comprises a crystal part in which c-axis is aligned in a direction parallel to a normal vector of a surface of the oxide semiconductor film.

14. The semiconductor memory device according to claim 1, wherein the electrode is a drain electrode.

15. The semiconductor memory device according to claim 1, wherein a potential of the capacitor is controlled by the transistor.

* * * * *